US012471407B2

(12) United States Patent
Hefiana

(10) Patent No.: US 12,471,407 B2
(45) Date of Patent: Nov. 11, 2025

(54) LIGHT-CONVERSION LAYER AND PHOTOVOLTAIC SYSTEM

(71) Applicant: Swiss Solar Space SA, Lausanne (CH)

(72) Inventor: Nasser Hefiana, Lausanne (CH)

(73) Assignee: Swiss Solar Space SA, Lausanne (CH)

( * ) Notice: Subject to any disclaimer, the term of this patent is extended or adjusted under 35 U.S.C. 154(b) by 0 days.

(21) Appl. No.: 18/283,431

(22) PCT Filed: Mar. 22, 2022

(86) PCT No.: PCT/IB2022/052611
§ 371 (c)(1),
(2) Date: Sep. 21, 2023

(87) PCT Pub. No.: WO2022/201027
PCT Pub. Date: Sep. 29, 2022

(65) Prior Publication Data

US 2024/0170598 A1 May 23, 2024

(30) Foreign Application Priority Data

Mar. 22, 2021 (CH) .................................... 00306/21

(51) Int. Cl.
*H10F 77/45* (2025.01)
*H10F 30/221* (2025.01)
(Continued)

(52) U.S. Cl.
CPC ......... *H10F 77/45* (2025.01); *H10F 30/2215* (2025.01); *H10F 77/12485* (2025.01); *H10F 77/1437* (2025.01)

(58) Field of Classification Search
CPC ................. H10F 77/45; H10F 77/1437; H10F 77/12485; H10F 30/2215
See application file for complete search history.

(56) References Cited

U.S. PATENT DOCUMENTS

2018/0257421 A1* 9/2018 Hefyene .............. B42D 25/387
2018/0323352 A1* 11/2018 Takano .................. H10H 20/84

FOREIGN PATENT DOCUMENTS

WO 2017089857 A1 6/2017

OTHER PUBLICATIONS

International Search Report issued Jan. 9, 2022 in counterpart International Application No. PCT/IB2022/052611.

(Continued)

*Primary Examiner* — Jayne L Mershon
(74) *Attorney, Agent, or Firm* — Blank Rome LLP

(57) ABSTRACT

A photovoltaic system comprises a photovoltaic cell, a substrate, and a light-conversion layer. The photovoltaic cell converts incident light into electricity and is responsive to a range of frequencies of incident light that is less than all frequencies of the incident light. The substrate is disposed between the photovoltaic cell and the incident light so that the incident light passes through the substrate to illuminate the photovoltaic cell. The light-conversion layer is disposed on the substrate so that incident light illuminates the light-conversion layer and the light-conversion layer converts a broad frequency band of incident light outside the range to light within the range and is emitted toward the photovoltaic cell to illuminate the photovoltaic cell with converted light.

11 Claims, 23 Drawing Sheets

Cover Glass
30
50
40
60
51
52
50

(51) Int. Cl.
*H10F 77/124* (2025.01)
*H10F 77/14* (2025.01)

(56) References Cited

OTHER PUBLICATIONS

McKittrick, Joanna et al. “Review: Down Conversion Materials for Solid-State Lighting.” Journal of American Ceramic Society; May 2014, vol. 97, No. 5. 27 pp. 1327-1352. DOI:10.1111/jace.12943.
Lai, Yen-Lin et al. “Origins of efficient green light emissions in phase-separated InGaN quantum well.” Nanotechnology vol. 17, No. 15, Aug. 14, 2006, pp. 3734-3739. DOI:10.1088/0957-4484/17/15/020.
Liu, Chuan-Pu et al. “Interface characterization and indium content of indium-rich quantum dots in InGaN/GaN multiple quantum wells.” Applied Surface Science 252 (2006) 3922-3927. available online at www.sciencedirect.com DOI:10.1016/j.spsusc.2005.09.024.
Essig et al., Raising the one-sun conversion efficiency of III-V/Si solar cells to 32.8% for two junctions and 35.9% for three junctions in Nature Energy 2, 17144 (2017), DOI: 10.1038/nenergy.2017.144, 9 pages.

* cited by examiner

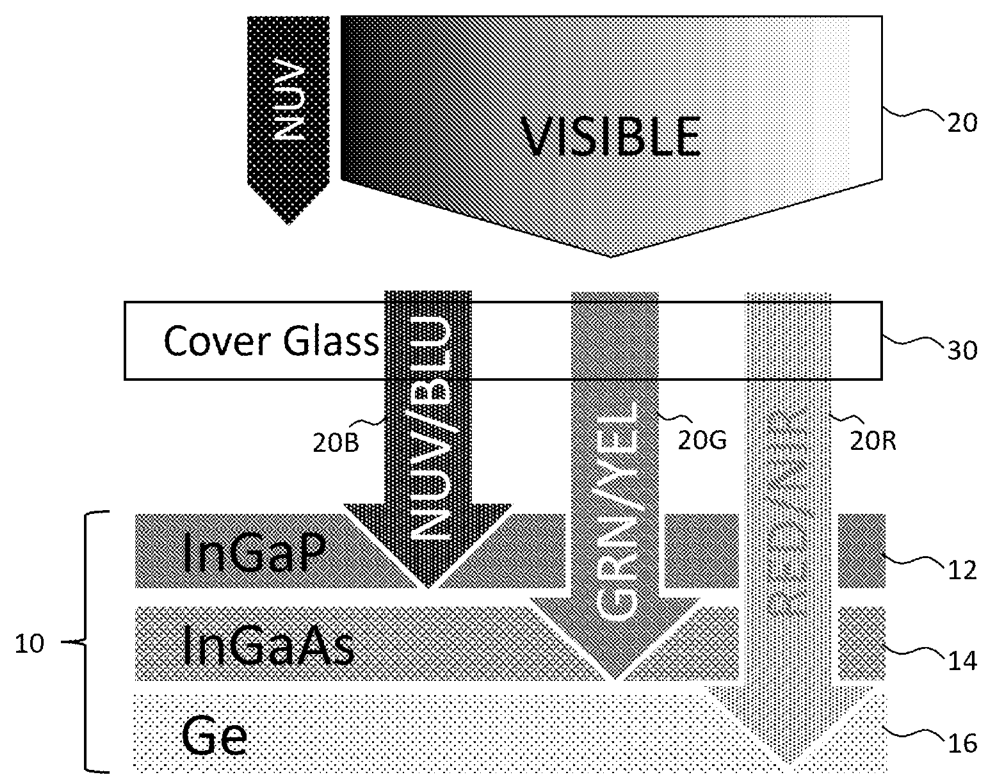
*FIG. 1A – Prior Art*

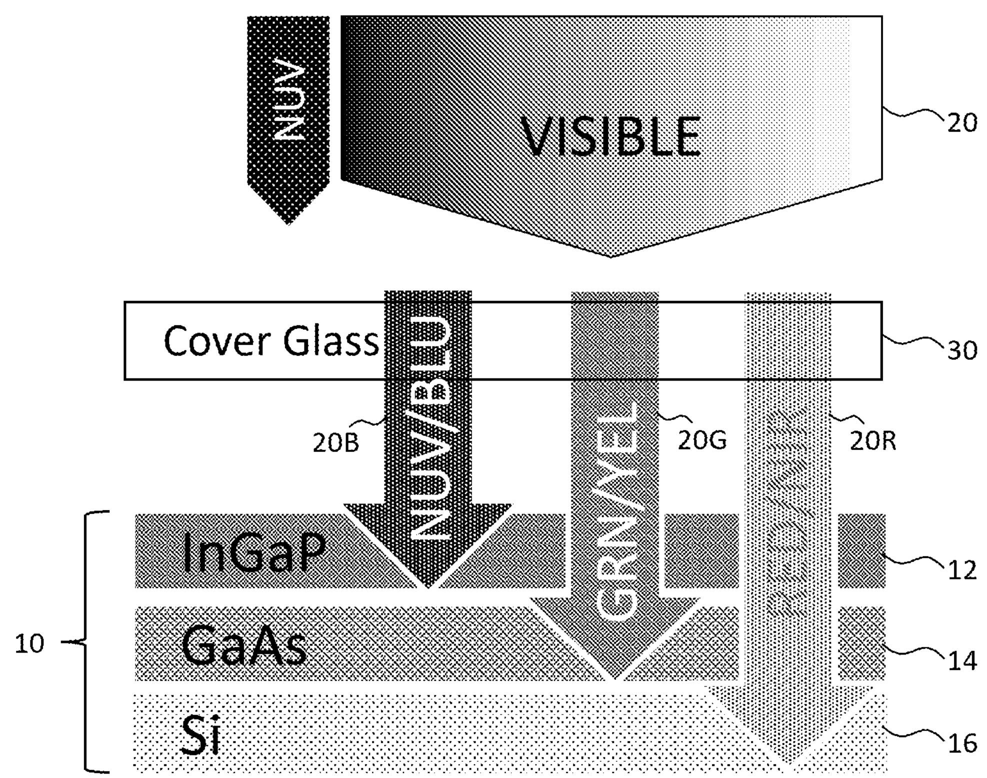
*FIG. 1B – Prior Art*

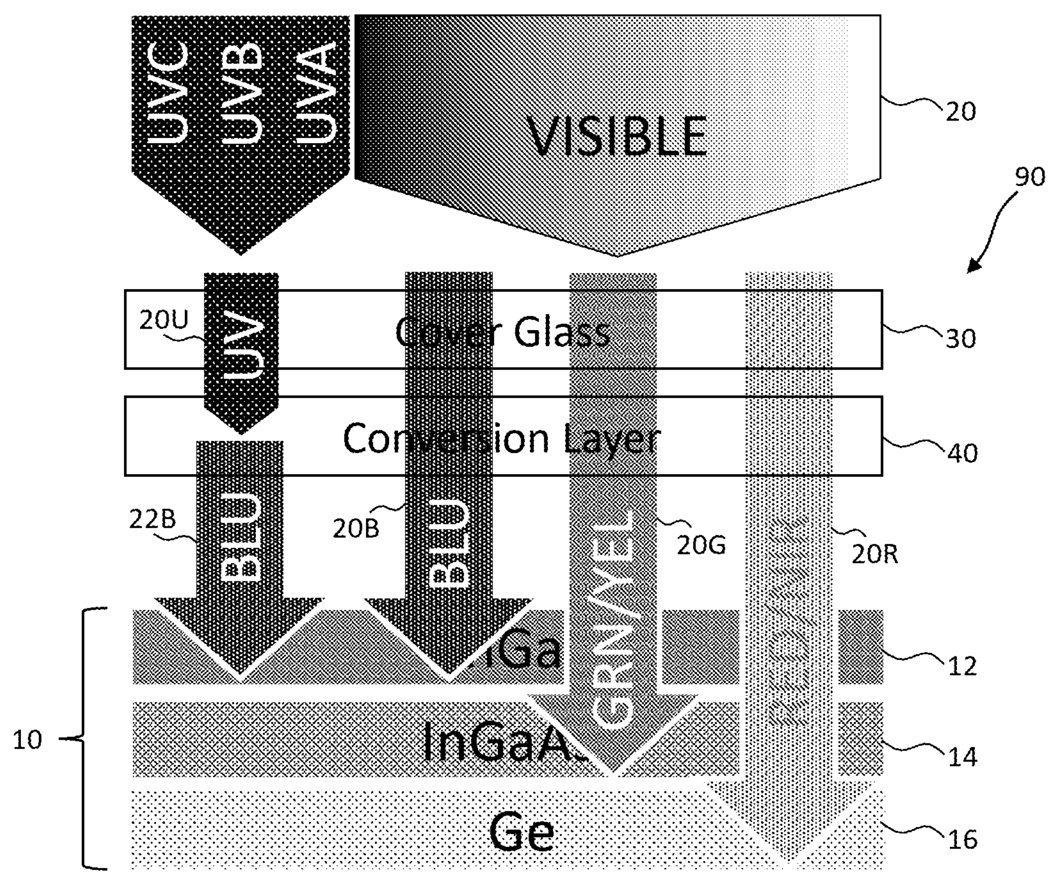
FIG. 2A1

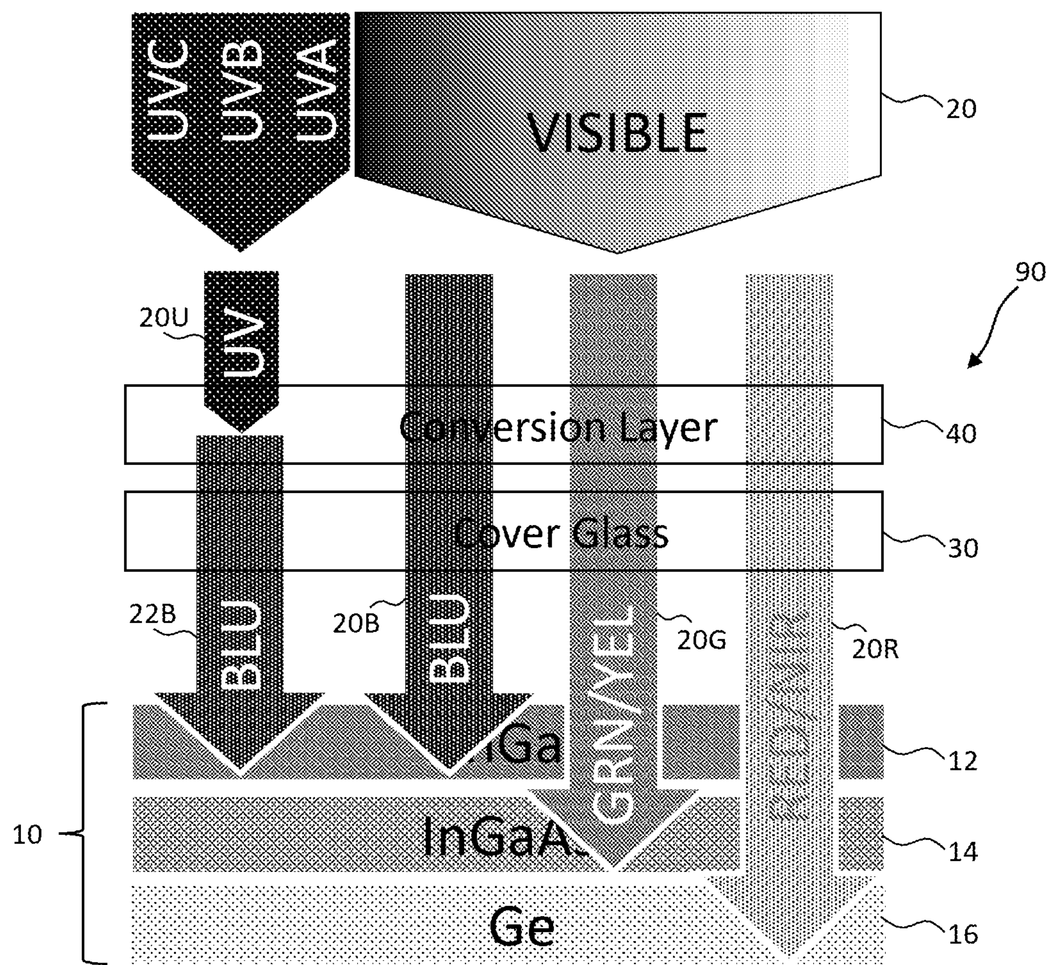
FIG. 2A2

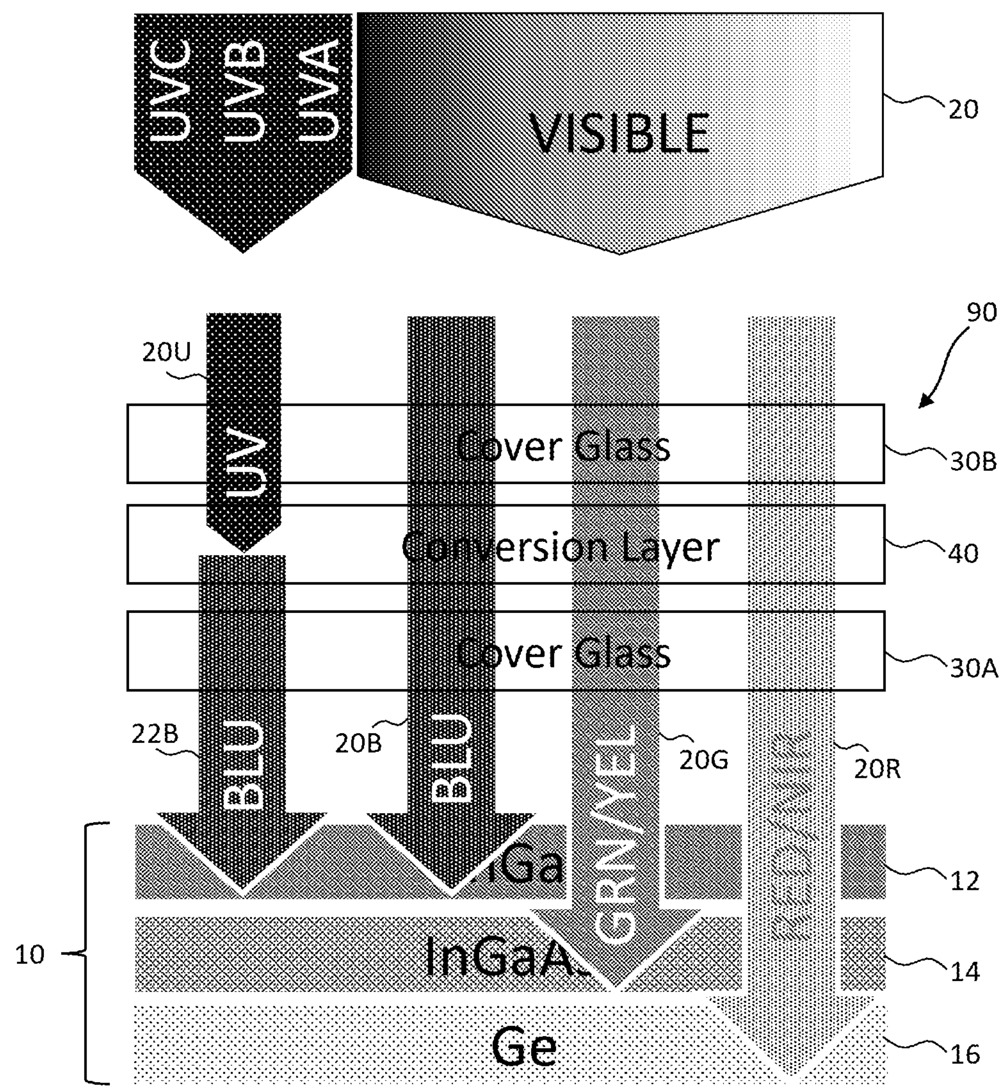
FIG. 2A3

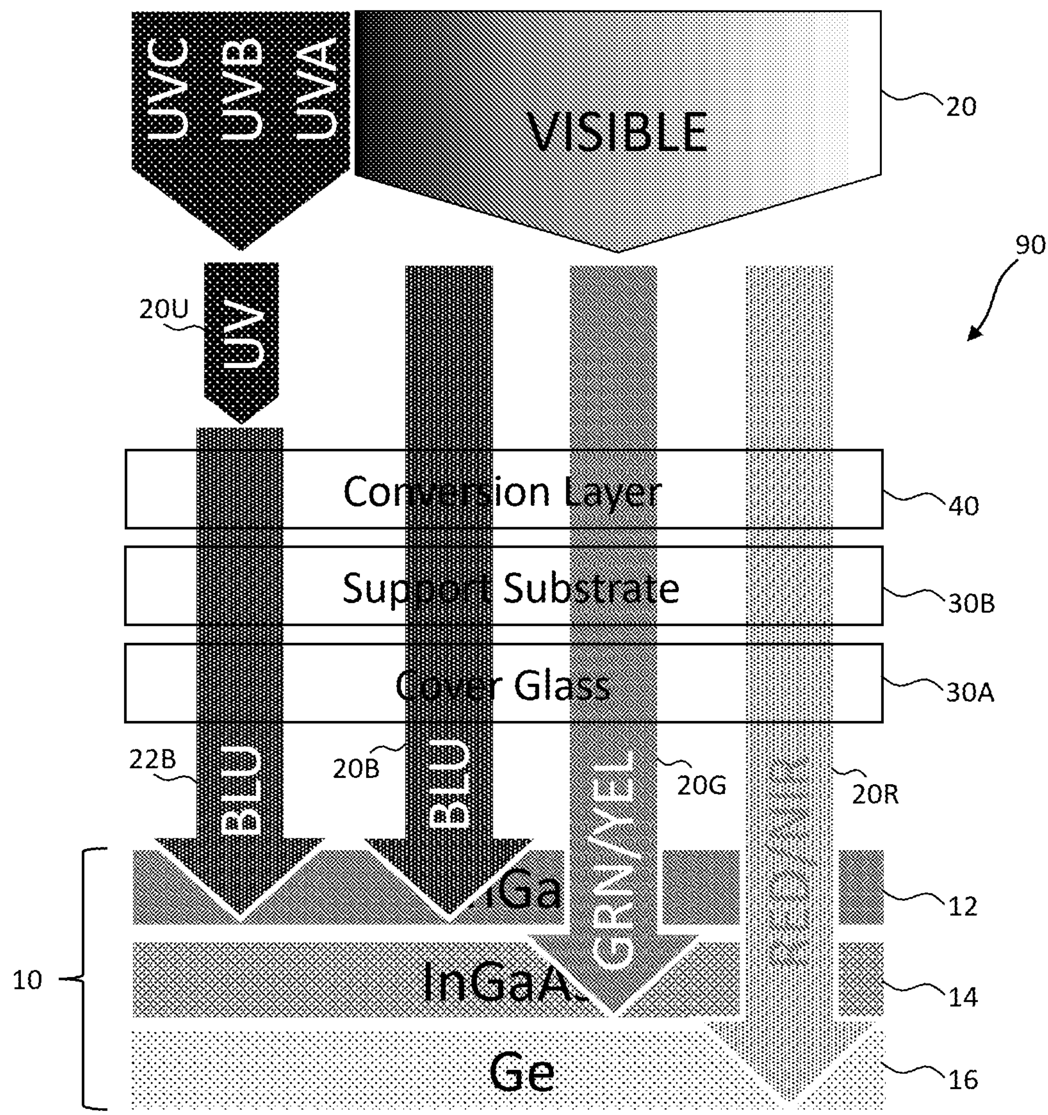
*FIG. 2A4*

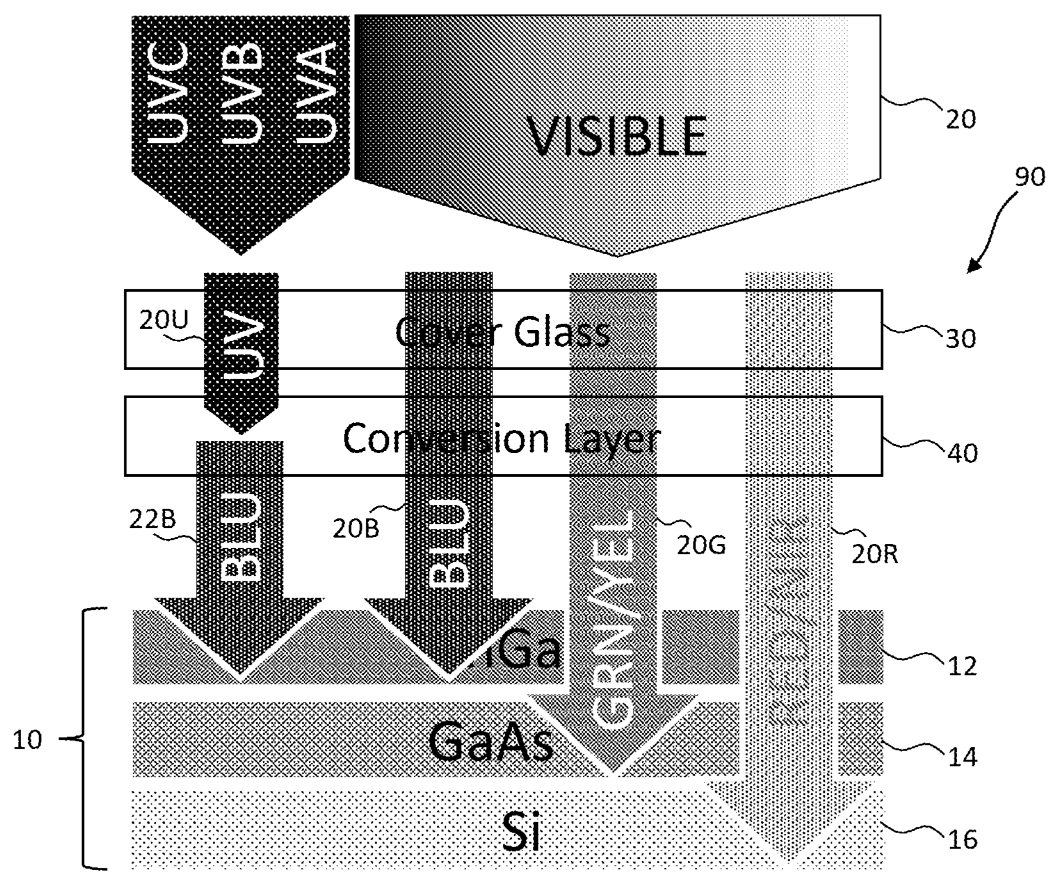
*FIG. 2A5*

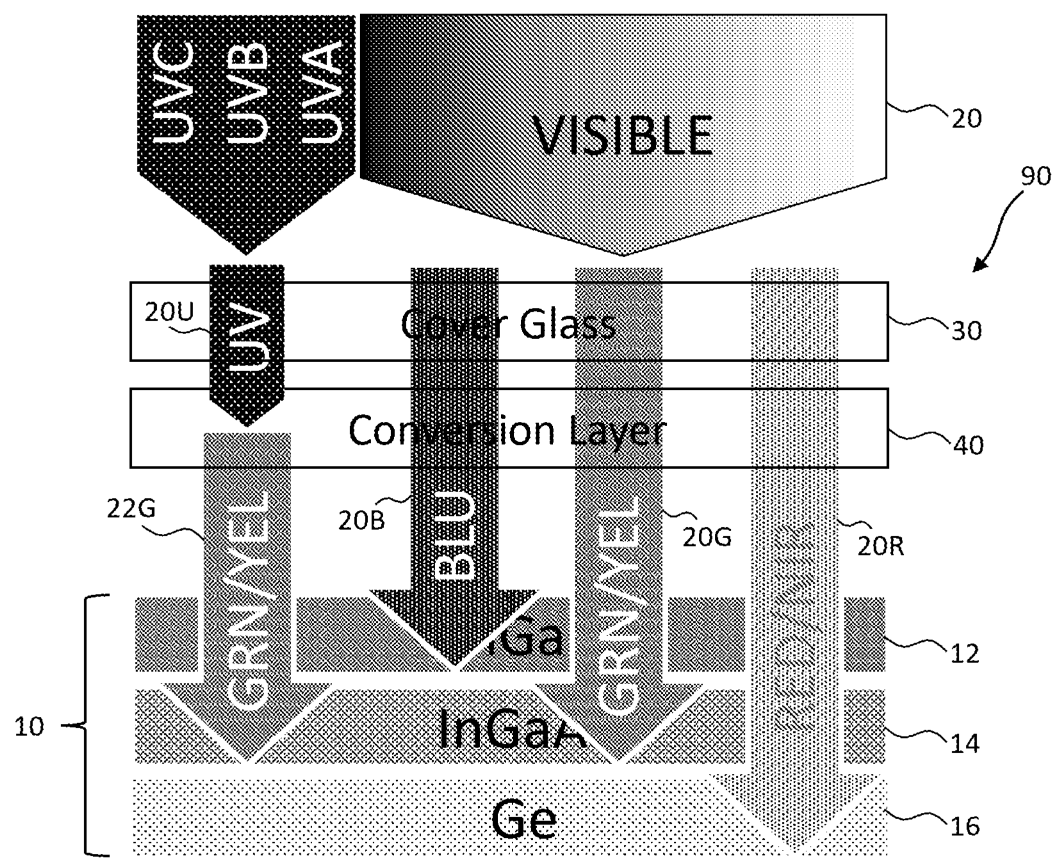
*FIG. 2B1*

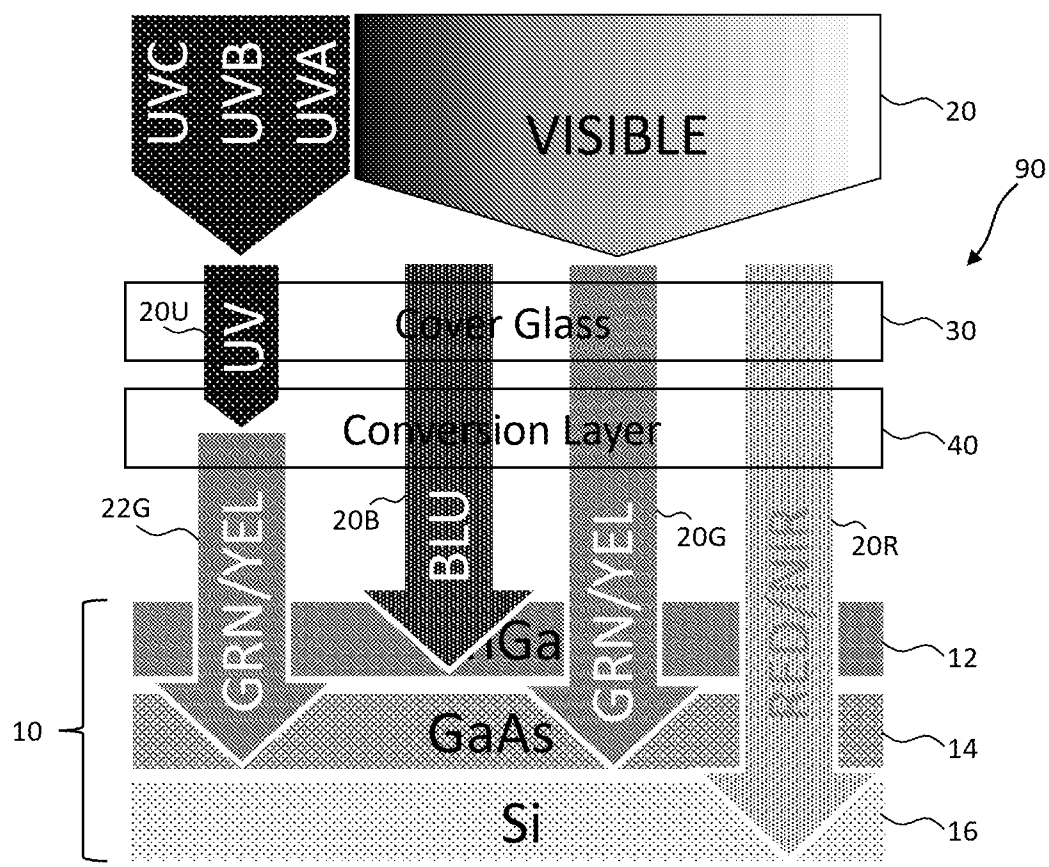
*FIG. 2B2*

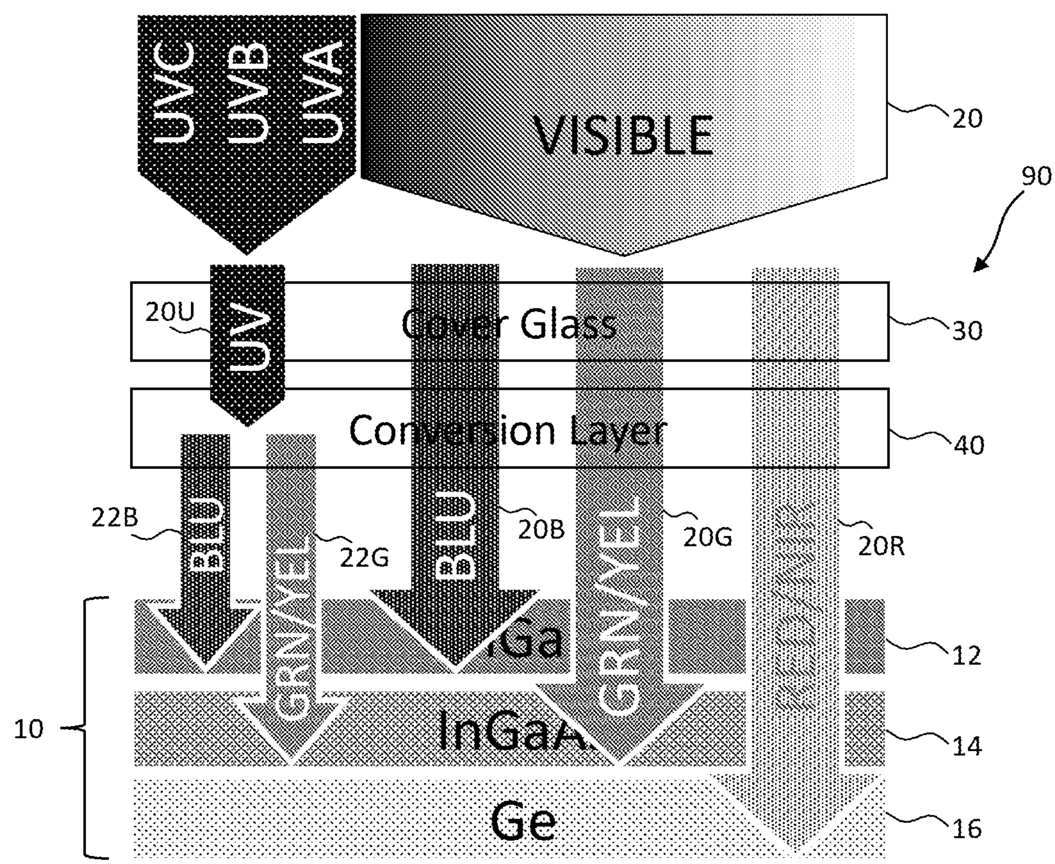
FIG. 2C1

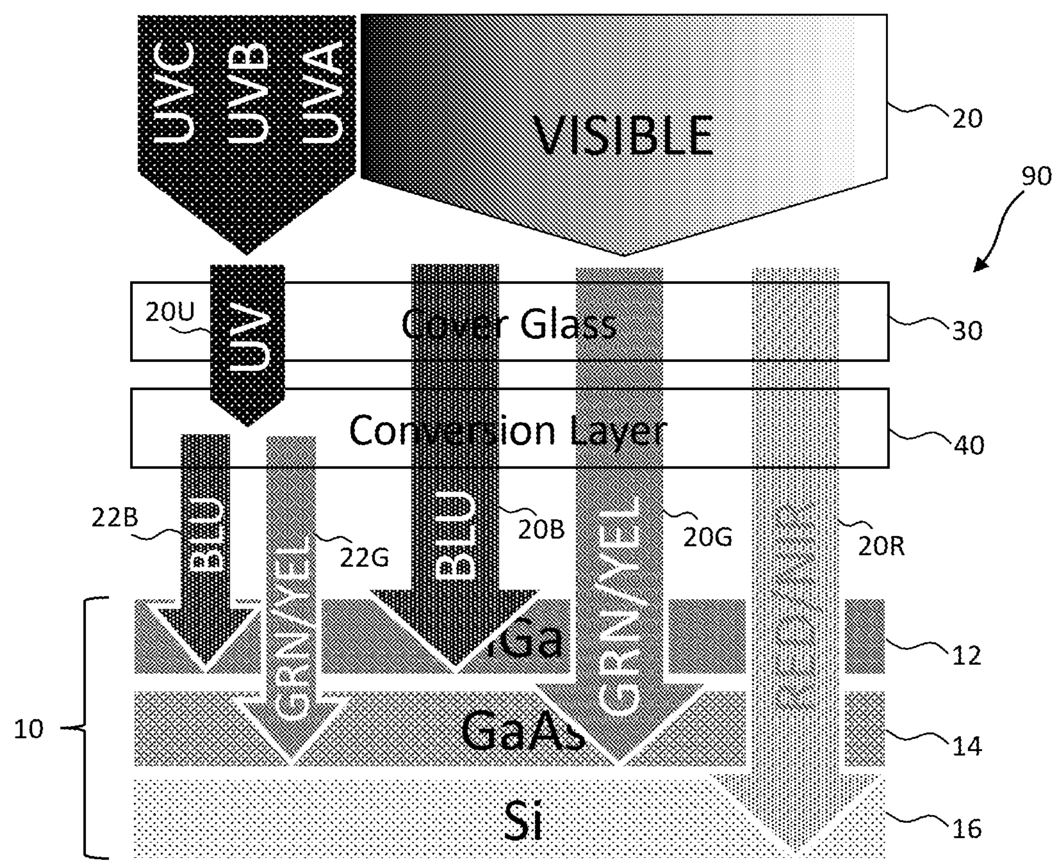
*FIG. 2C2*

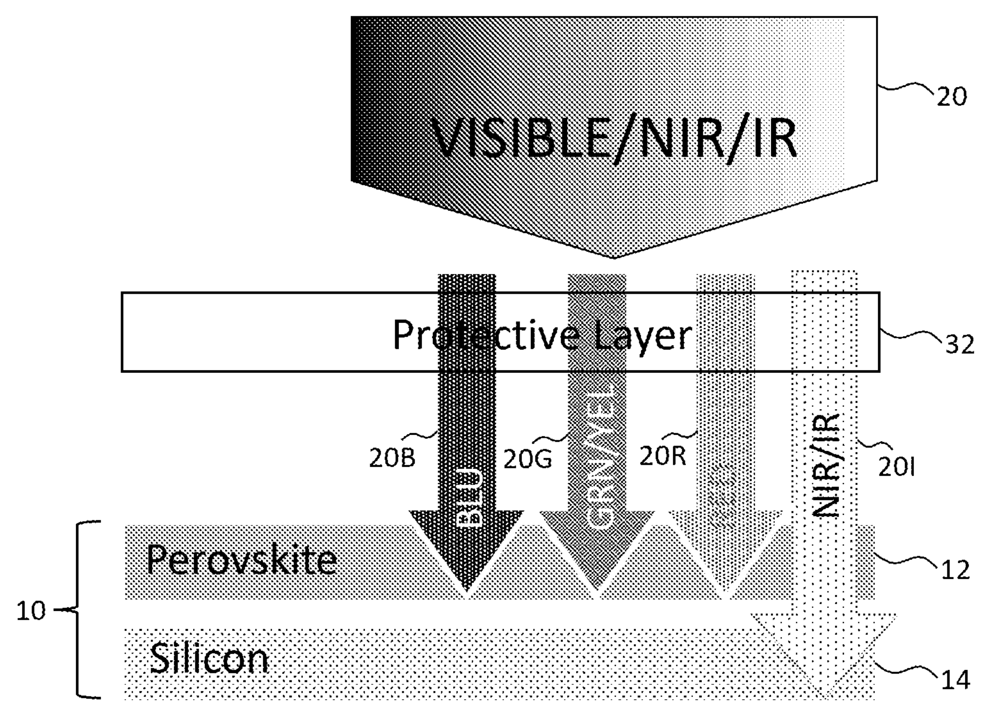
*FIG. 3 – Prior Art*

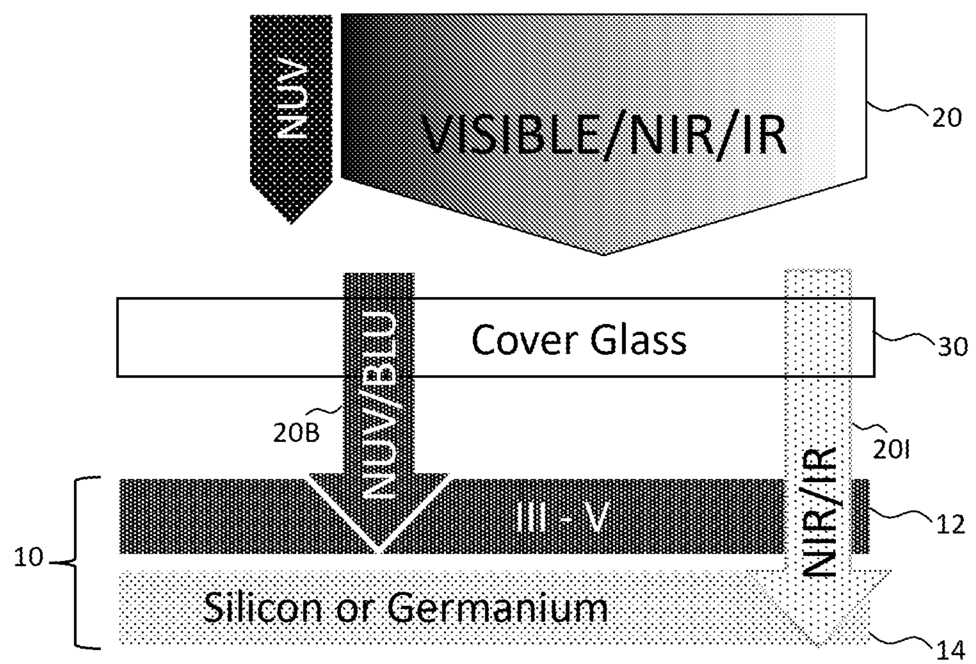
*FIG. 5A – Prior Art*

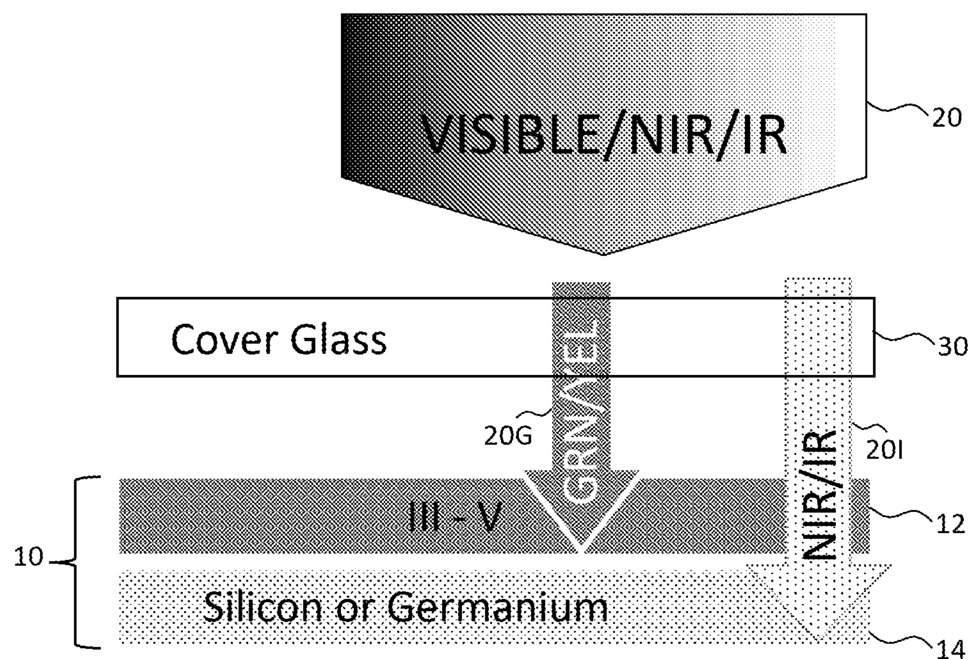
*FIG. 5B – Prior Art*

LIGHT-CONVERSION LAYER AND PHOTOVOLTAIC SYSTEM

CROSS REFERENCE TO RELATED APPLICATIONS

This application is a national stage of International Patent Application No. PCT/IB2022/052611 filed Mar. 22, 2022, and is related to WO 2019/087038 filed Oct. 29, 2018, entitled Device for a Digital Writing Instrument by Hefiana and WO 2017/089857 entitled Method for Labeling Products with a Transparent Photoluminescent Label and Transparent Photoluminescent Label, by Hefiana et al, the contents of which are incorporated herein by reference in their entirety.

TECHNICAL FIELD

The present disclosure relates to photovoltaic systems that convert incident light into electrical power.

BACKGROUND OF THE DISCLOSURE

Photovoltaic systems comprising solar cells are widely used to convert ambient incident light, such as sunlight, into electricity. Solar cells are used in portable electronic systems and in large industrial arrays to produce electricity for a community power grid.

Efficiency is an important attribute of photovoltaic systems and much effort has been spent on improving the energy conversion efficiency from incident light to electricity. Typical conversion rates can exceed 20%-30%. Because solar cells depend on the specific materials used to convert light to electricity, they tend to convert only a small fraction of the incident light. To overcome this limitation, solar cells today are often multi-junction cells that include multiple material sets that are each responsive to a different range of frequencies, for example red light, green light, and blue light. The article “Raising the one-sun conversion efficiency of III-V/Si solar cells to 32.8% for two junctions and 35.9% for three junctions” in Nature Energy 2, 17144 (2017), DOI: 10.1038/nenergy.2017.144 by Essig et al discusses multi-junction solar cells.

Cost is also an important factor in the usefulness of photovoltaic systems. The materials used in solar cells, for example crystalline silicon, can be expensive and relatively small. To use the expensive materials more efficiently, concentrated photovoltaic systems use lenses to focus ambient sunlight onto solar cells to increase the amount of light incident on the solar cells. Multi-junction concentrated photovoltaic systems can reach efficiencies over 40%. However, such systems typically require a mechanical motion platform to position the lenses appropriately with respect to the motion of the sun.

There remains a need, therefore, for more efficient photovoltaic systems that improve light conversion efficiency and reduce costs.

SUMMARY OF THE DISCLOSURE

A photovoltaic system comprises a photovoltaic cell, a substrate, and a light-conversion layer. The photovoltaic cell converts incident light into electricity and is responsive to a range of frequencies of incident light that is less than all frequencies of the incident light. The substrate is disposed between the photovoltaic cell and the incident light so that the incident light passes through the substrate to illuminate the photovoltaic cell. The light-conversion layer is disposed on the substrate so that incident light illuminates the light-conversion layer and the light-conversion layer converts broadband incident light outside the range to light within the range and is emitted toward the photovoltaic cell to illuminate the photovoltaic cell with converted light.

According to embodiments of the present disclosure, a photovoltaic system, comprises a photovoltaic cell that converts incident light into electricity, the photovoltaic cell responsive to a range of frequencies of incident light that is less than all frequencies of the incident light; a substrate disposed between the photovoltaic cell and the incident light so that the incident light passes through the substrate to illuminate the photovoltaic cell; and a conversion layer disposed on the substrate, wherein the conversion layer converts a broad frequency band of incident light outside the range into light within the range and the converted light illuminates the photovoltaic cell.

The conversion layer can be disposed between the substrate and the photovoltaic cell. The conversion layer can be disposed on the substrate. The conversion layer can be an unpatterned coating on the substrate. The substrate can be glass. The conversion layer can be any of the light-conversion layers defined in the present disclosure, including light-conversion layers with a plurality of sub-layers in a material stack.

The range can include substantially visible light. The range can include any one or combination of red, green, and blue light. The incident light outside the range can be ultraviolet light or infrared light. The ultraviolet light can be UV-A light (e.g., with wavelengths from ~315 nm to 400 nm), UV-B light (e.g., with wavelengths from ~280 nm to ~315 nm), or UV-C light (e.g., with wavelengths from 150~200 nm to ~280 nm) or any combination of UBV-A light, UV-B light, and UV-C light.

The photovoltaic cell can be responsive to any one or combination of red, green, and blue light. The photovoltaic cell can be a triple-junction cell responsive to red, green, and blue light. According to some embodiments of the present disclosure, a photovoltaic system that converts both visible light (e.g., red, yellow, green, and blue light) and ultraviolet light into electric current comprises three or fewer photovoltaic cells. According to some embodiments of the present disclosure, this photovoltaic system further comprises a conversion layer or a light-conversion layer as any form described in the present text, including the form with a plurality of sub-layers in a material stack. According to some embodiments of the present disclosure, this photovoltaic system further comprises a substrate disposed between the photovoltaic cell and the incident light, the conversion layer or light-conversion layer being disposed on the substrate.

The conversion layer can comprise a plurality of sub-layers in a material stack. The number of sub-layers can be no less than 50, 30, or 20, for example no less than 10. The material stack can comprise at least a first layer of a first material alternating with a second layer of a second material, wherein the interface between the first layer and the second layer of the pairs of layers includes quantum nano-structures. The first sub-layer can have a thickness of less than or equal to 1 micron and the second sub-layer can have a thickness of less than or equal 10 nm. The material stack can comprise successive pairs of alternating first and second layers. In some embodiments, the number of pairs of layers is no less than 10, 20, or 50, or greater than 10, 20, or 50. The conversion layer can be responsive to ultraviolet light to emit visible light. The conversion layer can be responsive to ultraviolet light to emit light having frequencies within the range of frequencies. In some embodiments, the range of frequencies is visible light. In some embodiments, the range of frequencies includes near-infrared or infrared light.

The conversion layer can be substantially transparent to visible light. The conversion layer can be substantially transparent to light having frequencies within the range of frequencies.

According to embodiments of the present disclosure, a light-conversion layer comprises a plurality of sub-layers in a material stack. The plurality of sub-layers comprises at least a first sub-layer of a first material alternating with a second sub-layer of a second material to form multiple pairs of first and second sub-layers in the material stack. Each pair of sub-layers comprises one first sub-layer adjacent to and in contact with one second sub-layer. The interface between the first sub-layer and the second sub-layer of the pairs of sub-layers includes quantum nano-structures and the first material comprises GaInN. According to some embodiments of the present disclosure, the second material comprises at least GaN, AlGaN, or InAlGaN. In some embodiments, the quantum nano-structures are responsive to a range of frequencies of incident light that is less than all frequencies of the incident light to convert a broad frequency band of incident light outside the range into light within the range.

In some embodiments, at least some of the first sub-layers (e.g., GaN sub-layers) are doped (e.g., either p-doped or n-doped). In some embodiments, some of the first sub-layers share a common doping (e.g., some of the GaN layers are n-doped) and the others of the first sub-layers are not doped. In some embodiments, all of the first sub-layers have a common doping (e.g., all of the GaN layers are p-doped or all of the GaN layers are n-doped). In some embodiments, all of the first sub-layers (e.g., GaN sub-layers) are n-doped.

In some embodiments, the material stack comprises an additional single sub-layer (e.g., not a pair of sub-layers) disposed on the top or bottom of the material stack and adjacent to a sub-layer of a different type (e.g., an additional single first sub-layer adjacent to a second sub-layer). In some embodiments, the material stack does not conduct electrical current (e.g., is not electrically responsive to emit light) but is rather optically responsive (e.g., only optically responsive).

In some embodiments, the number of sub-layers is no less than 50. In some embodiments, the first sub-layer has a thickness of less than or equal to 1 micron and the second sub-layer has a thickness of less than or equal 10 nm. In some embodiments, the first sub-layer has a thickness between 1.5 and 3.5 times a thickness of the second sub-layer.

According to some embodiments of the present disclosure, the conversion layer is responsive to ultraviolet light to emit visible light or near infrared light.

Some embodiments of the present disclosure comprise a support layer and the material stack is disposed on the support layer. In some embodiments, the material stack is disposed directly on the support layer without any intervening layers between the support layer and the material stack. In some embodiments, the support layer is a dielectric. Some embodiments of the present disclosure comprise a support layer and a buffer layer and the buffer layer is disposed on the support layer and the material stack is disposed on the buffer layer on a side of the buffer layer opposite the support layer. In some embodiments, the material stack is disposed directly on the buffer layer without any intervening layers between the buffer layer and the material stack. The support layer can be a dielectric. According to some embodiments of the present disclosure, the buffer layer can comprise multiple sub-layers. The buffer layer can comprise a sub-layer of GaInN or InAlN. In some embodiments, the sub-layer of GaInN is 3-6 microns thick or the sub-layer of InAlN is 3-6 microns thick.

Thus, according to some embodiments of the present disclosure, a light-conversion layer comprises a support layer, a buffer layer disposed on the support layer, and a plurality of sub-layers in a material stack disposed on a side of the buffer layer opposite the support layer. This light-conversion layer forms a set of stacked layers in the form of a light-conversion assembly. The plurality of sub-layers comprises at least a first sub-layer of a first material alternating with a second sub-layer of a second material to form multiple pairs of first and second sub-layers in the material stack. Each pair of sub-layers comprises one first sub-layer and one second sub-layer. The interface between the first sub-layer and the second sub-layer of the pairs of sub-layers includes quantum nano-structures. In some embodiments, the quantum nano-structures are responsive to a range of frequencies of incident light that is less than all frequencies of the incident light to convert a broad frequency band of incident light outside the range into light within the range.

BRIEF DESCRIPTION OF THE DRAWINGS

FIG. 1A illustrates a triple-junction solar cell comprising InGaP, InGaAs, and Ge and FIG. 1B illustrates a triple-junction solar cell comprising InGaP, GaAs, and Si according to the prior art;

FIGS. 2A1-2C2 illustrate triple-junction photovoltaic systems comprising InGaP, InGaAs, and Ge or InGaP, GaAs, and Si with various cover glass arrangements according to embodiments of the present disclosure;

FIG. 3 illustrates a dual-junction solar cell comprising perovskite and silicon according to the prior art;

FIGS. 5A and 5B illustrate dual-junction solar cells comprising a compound semiconductor and silicon according to the prior art;

DETAILED DESCRIPTIONS OF CERTAIN EMBODIMENTS

Figure 4A:
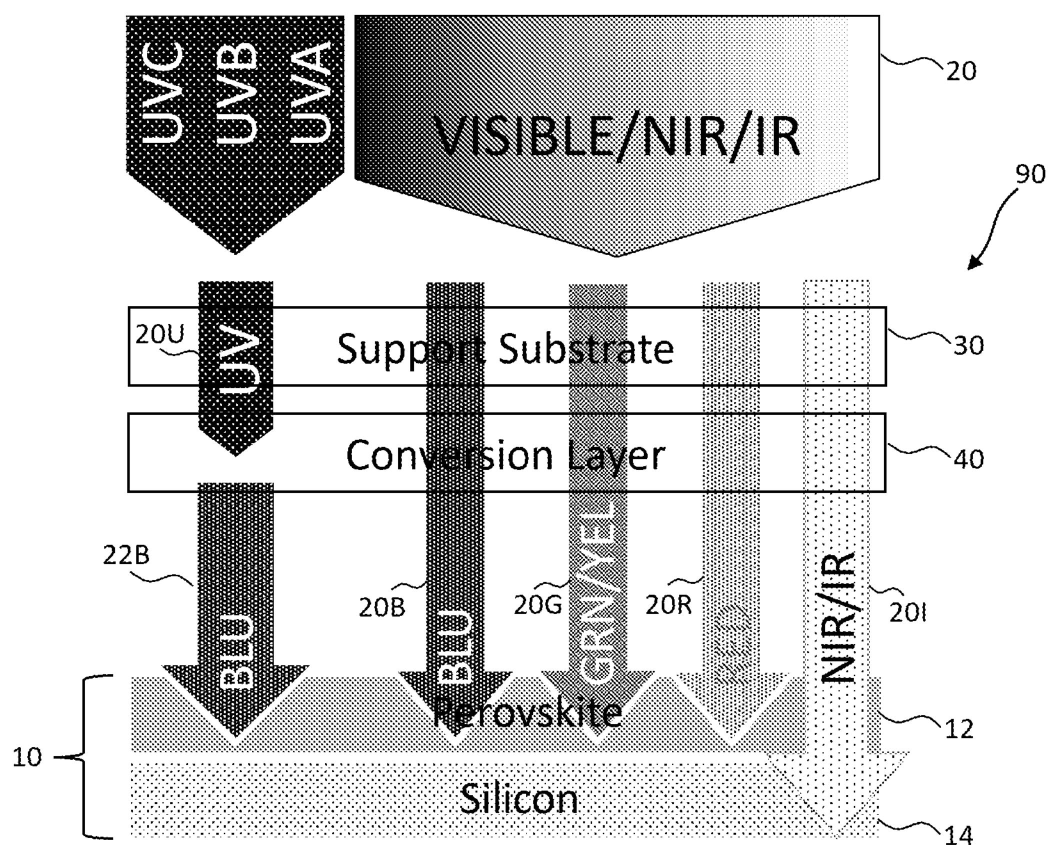
FIGS. 4A-4C illustrate dual-junction photovoltaic systems comprising perovskite and silicon according to embodiments of the present disclosure.

Solar cells comprise one or more photovoltaic cells that each convert a restricted range of wavelengths into electricity. The photovoltaic cells can comprise a semiconductor material, for example a crystalline semiconductor material, that forms a p-n junction responsive to light of a specific frequency to produce an electrical current that is collected with electrodes disposed on either side of the semiconductor material. Multiple different photovoltaic cells can be stacked to convert multiple restricted ranges of light incident on the solar cell to electricity.

For example, as illustrated in FIG. 1A, a triple-junction photovoltaic cell stack 10 responsive to light 20 comprises a first photovoltaic cell 12 (e.g., top cell 12 adjacent a protective cover glass 30) comprising a first layer of InGaP that absorbs near UV (NUV) light to blue light 20B to make electricity, a second photovoltaic cell 14 (e.g., middle cell 14 on a side of top cell 12 opposite cover glass 30) comprising a second layer of InGaAs that absorbs green-to-yellow light 20G to make electricity, and a third photovoltaic cell 16 (e.g., bottom cell 16 on a side of middle cell 14 opposite top cell 12) comprising a third layer of Ge that absorbs red-to-near-infrared (NIR) light 20R to make electricity. FIG. 1B illustrates a similar triple-junction photovoltaic cell stack 10 with a first layer of InGaP, a second layer of GaAs, and a third layer of Si. Each of first, second, and third photovoltaic cells 12, 14, 16 can be electrically connected in series to provide an electrical current at a voltage equal to the sum of the voltages of first, second, and third photovoltaic cells 12, 14, 16. A cover glass 30 can protect first, second, and third photovoltaic cells 12, 14, 16 from the environment and can be a dielectric that does not conduct electrical current. In some embodiments, first, second, and third photovoltaic cells 12, 14, 16 are mounted on cover glass 30, which then serves as a substrate (e.g., a dielectric substrate) for first, second, and third photovoltaic cells 12, 14, 16. As indicated in FIG. 1, first, second, and third photovoltaic cells 12, 14, 16 are together largely responsive to incident visible light 20 and are not responsive to light 20 having frequencies outside the visible light range (e.g., deep-ultraviolet light 20U and deep-infrared light 20I, as discussed further below). Such triple-junction solar cells can have an efficiency as high as 32%-35%. (As used herein, light 20 refers to any frequency of electromagnetic radiation and in particular to ultraviolet light 20U, to visible light 20 such as red-to-NIR light 20R, green-to-yellow light 20G, and blue light 20B, and to infrared or near infrared light 20I. Ultraviolet light 20U can be UV light 20U and infrared or near infrared light 20I can be IR light 20I. In the figures, light 20 of increasing frequency and energy is illustrated with arrows shaded darker and photovoltaic cells sensitive to light 20 of increasing frequency and energy are illustrated with rectangles similarly shaded darker. As will be appreciated by knowledgeable practitioners, the specification of different colored light 20 frequency ranges and the frequency response of different materials can vary, so that the specified frequency ranges of light 20, associated colors, and material responses are exemplary and are not limiting herein.)

It is possible to make solar cells with more junctions (more photovoltaic cells) that are responsive to more frequencies of light 20. However, such additional layers can be very expensive.

According to embodiments of the present disclosure and as illustrated in FIGS. 2A-2C, a photovoltaic system 90 comprises a photovoltaic cell stack 10 comprising one or more photovoltaic cells (e.g., first photovoltaic cell 12, second photovoltaic cell 14, and third photovoltaic cell 16) that convert incident light 20 into electricity. First photovoltaic cell 12 is responsive to a range of frequencies of incident light 20 that is less than all frequencies of incident light 20. For example, ambient solar radiation can be incident light 20 and the range of light 20 frequencies that is less than all of incident light 20 can be visible light 20, for example red-to-NIR light 20R, green-to-yellow light 20G, or blue light 20B. A substrate 30 (e.g., cover glass 30) is disposed between first photovoltaic cell 12 and incident light 20 so that incident light 20 passes through substrate 30 to illuminate first photovoltaic cell 12. In some embodiments, cover glass 30 does not filter incident light 20; in some embodiments cover glass 30 can filter incident light 20.

According to some embodiments, photovoltaic system 90 comprises multiple, stacked photovoltaic cells (e.g., first photovoltaic cell 12, second photovoltaic cell 14, and third photovoltaic cell 16) in a photovoltaic cell stack 10 that each convert incident light 20 within the frequency range to which the photovoltaic cell is sensitive into electricity. A light-conversion layer 40 disposed on substrate 30 converts broadband incident light 20 with frequencies outside the sensitive range (e.g., ultraviolet light 20U) into converted light 22 within the sensitive range of frequencies (e.g., blue converted light 22B or green-to-yellow converted light 22G, collectively converted light 22) and the converted light 22 illuminates one or more of the photovoltaic cells (e.g., illuminates one or more of first photovoltaic cell 12, second photovoltaic cell 14, and third photovoltaic cell 16), at least one of which can be sensitive to the converted light 22 to produce electricity. A broadband light-conversion layer 40 can convert a broadband wavelength range of light 20 (for example a wavelength range from 375 nm to 200 nm, 400 nm to 315 nm, 315 nm to 280 nm or 280 nm to 200 nm), using layers each comprising a single material coating, for example a coating of a compound semiconductor, a perovskite, or a dielectric. A broadband wavelength range of light 20 can be no less than 200 nm, no less than 250 nm, no less than 300 nm, or no less than 375 nm Light-conversion layer 40 can be responsive to ultraviolet light 20U (for example one, any two, or all of UV-A light, UV-B light, and UV-C light). By converting incident light 20 outside the sensitive range of frequencies into incident light 20 within the sensitive range of frequencies (e.g., from incident light 20 into converted light 22), one or more of first, second, or third photovoltaic cell(s) 12, 14, 16 can receive and absorb more light 20 and make more electricity, improving the efficiency of photovoltaic system 90, for example by approximately 1% to 5%.

FIGS. 2A1-2A5 illustrate embodiments in which conversion layer 40 converts incident ultraviolet light 20U into blue converted light 22B. The blue converted light 22B and incident blue light 20B are absorbed by first photovoltaic cell 12 (e.g., comprising InGaP), incident green-to-yellow light 20G is absorbed by second photovoltaic cell 14 (e.g., comprising InGaAs), and incident red-to-NIR light 20R is absorbed by third photovoltaic cell 16 (e.g., comprising Ge). As shown in FIG. 2A1, conversion layer 40 is disposed on cover glass 30 between cover glass 30 and first photovoltaic cell 12, providing protection to conversion layer 40. Cover glass 30 can be a dielectric. As shown in FIG. 2A2, conversion layer 40 is disposed on cover glass 30 and cover glass 30 is disposed between conversion layer 40 and first photovoltaic cell 12 enabling conversion layer 40 to be coated on cover glass 30 after cover glass 30 and first, second, and third photovoltaic cells 12, 14, 16 are assembled. In some embodiments such as FIG. 2A3-2A4, cover glass 30 comprises multiple substrate layers 30A, 30B and conversion layer 40 can be disposed between multiple layers 30A, 30B as in FIG. 2A3 or on a side of multiple substrate layers 30A, 30B as shown in FIG. 2A4. FIGS. 2A1-2A4 illustrate embodiments in which first photovoltaic cell 12 comprises InGaP, second photovoltaic cell 14 comprises InGaAs, and third photovoltaic cell 16 comprises Ge. According to some embodiments and as illustrated in FIG. 2A5, first photovoltaic cell 12 comprises InGaP, second photovoltaic cell 14 comprises GaAs, and third photovoltaic cell 16 comprises Si. Any of cover glass 30 arrangements (e.g., cover glass 30 and conversion layer 40 or multiple substrate layers 30A, 30B) can be used with the photovoltaic cell layers as illustrated in FIG. 2A5.

FIGS. 2B1 and 2B2 illustrate embodiments in which conversion layer 40 converts incident ultraviolet light 20U into green-to-yellow converted light 22G. The incident blue light 20B is absorbed by first photovoltaic cell 12 (e.g., comprising InGaP as shown in FIGS. 2B1 and 2B2), green-to-yellow converted light 22G and incident green-to-yellow light 20G are absorbed by second photovoltaic cell 14 (e.g., comprising InGaAs as shown in FIG. 2B1 or GaAs as shown in FIG. 2B2), and incident red-to-NIR light 20R is absorbed by third photovoltaic cell 16 (e.g., comprising Ge as shown in FIG. 2B1 or Si as shown in FIG. 2B2). Any of the cover glass 30 arrangements shown in FIGS. 2A1-2A4 can be used with the embodiments of FIGS. 2B1 and 2B2.

FIGS. 2C1 and 2C2 illustrate embodiments in which conversion layer 40 converts incident ultraviolet light 20U into both blue converted light 22B and green-to-yellow converted light 22G. The incident blue light 20B and blue converted light 22B is absorbed by first photovoltaic cell 12 (e.g., comprising InGaP as shown in FIGS. 2C1 and 2C2), green-to-yellow converted light 22G and incident green-to-yellow light 20G are absorbed by second photovoltaic cell 14 (e.g., comprising InGaAs as shown in FIG. 2C1 or GaAs as shown in FIG. 2C2), and incident red-to-NIR light 20R is absorbed by third photovoltaic cell 16 (e.g., comprising Ge as shown in FIG. 2C1 or Si as shown in FIG. 2C2). Any of the cover glass 30 arrangements shown in FIGS. 2A1-2A4 can be used with the embodiments of FIGS. 2C1 and 2C2.

Figure 4B:
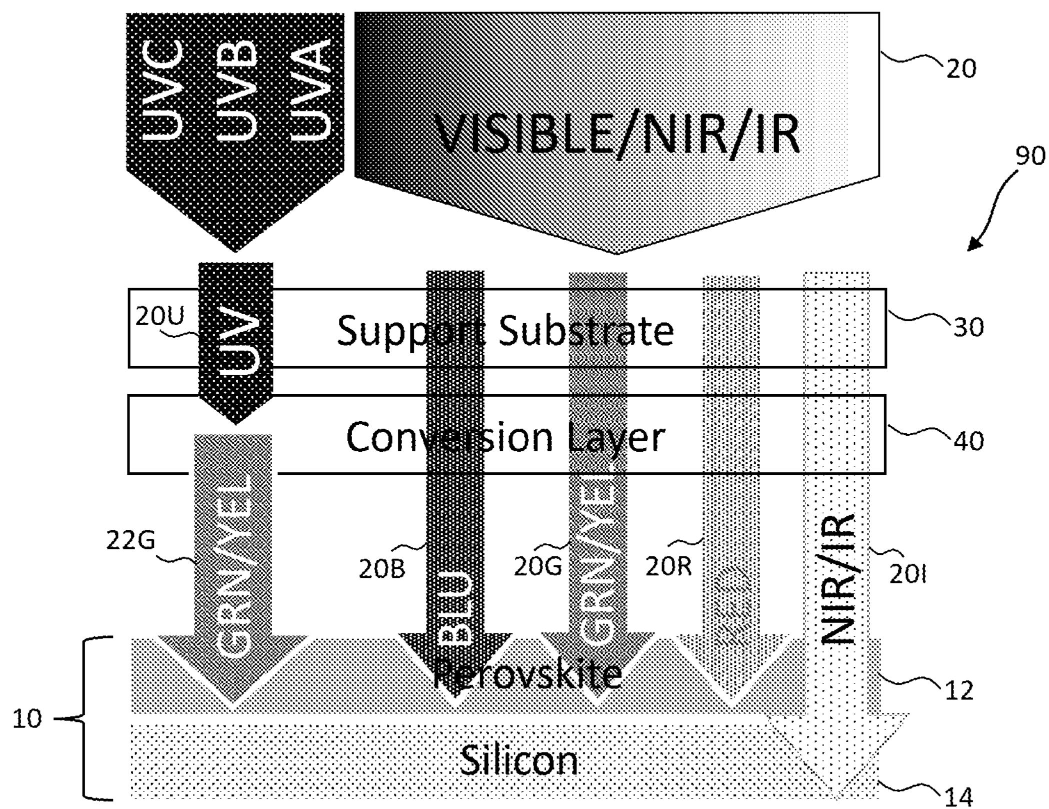
Figure 4C:
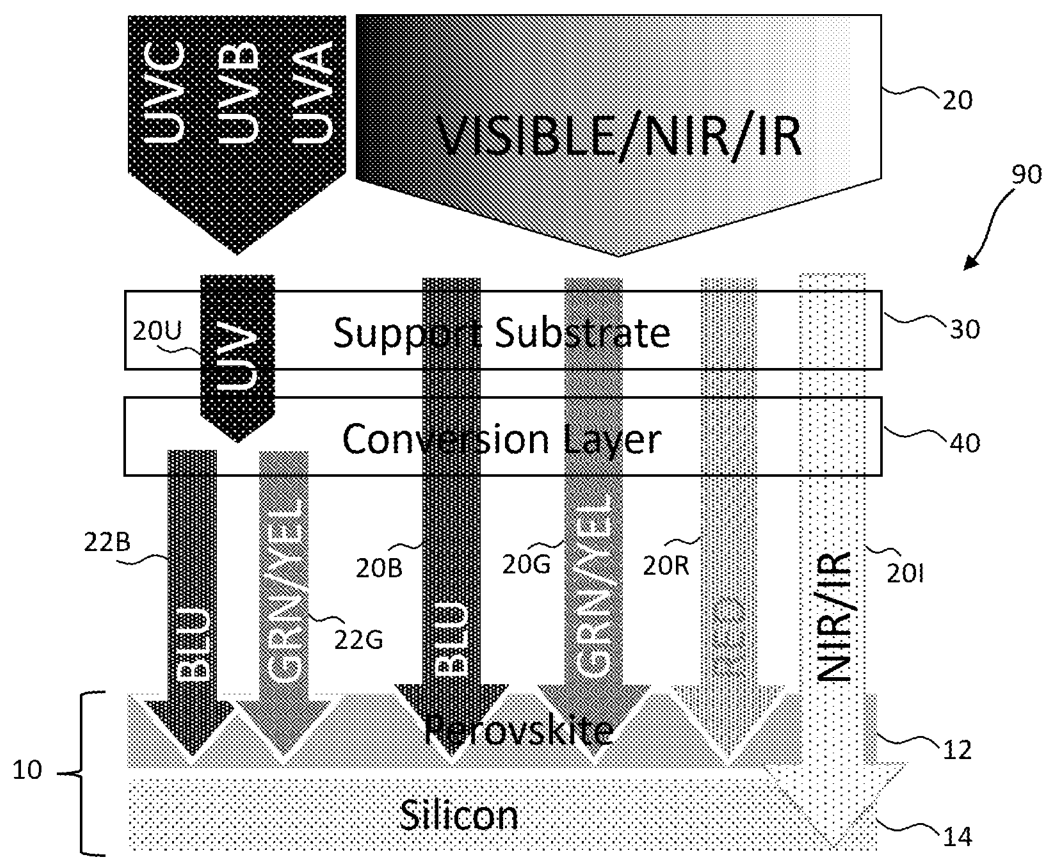
Figure 6A:
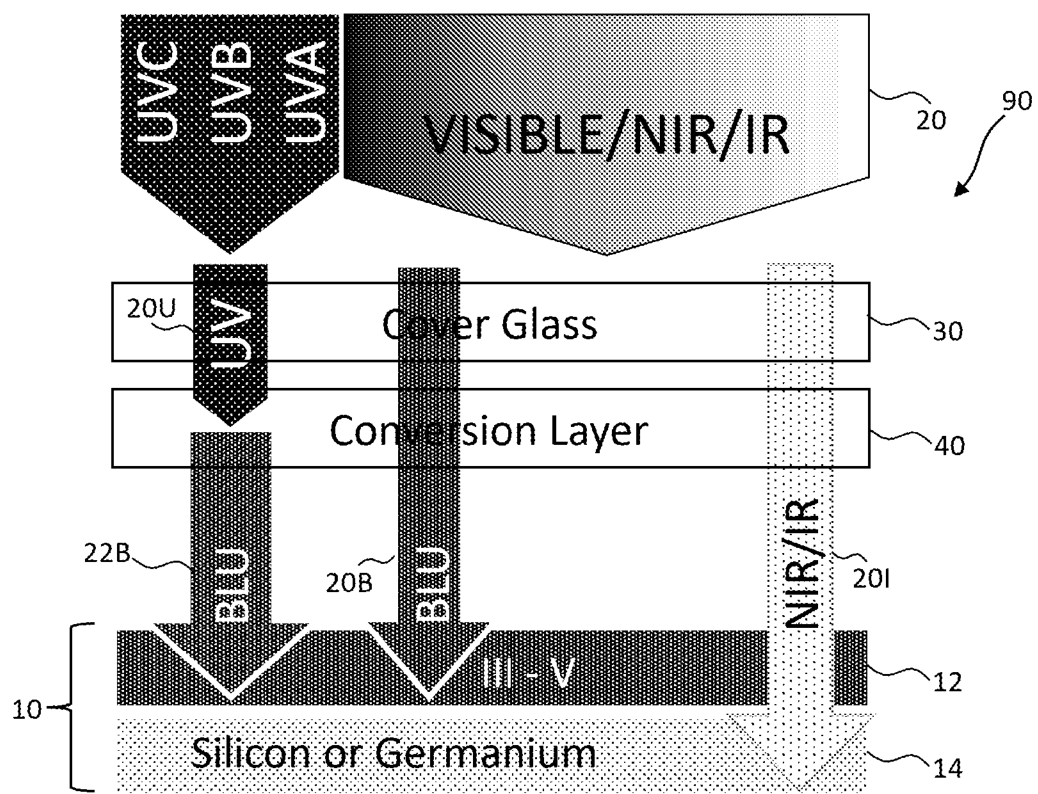
FIGS. 6A and 6B illustrate dual-junction photovoltaic systems comprising a compound semiconductor and silicon according to embodiments of the present disclosure.
Figure 6B:
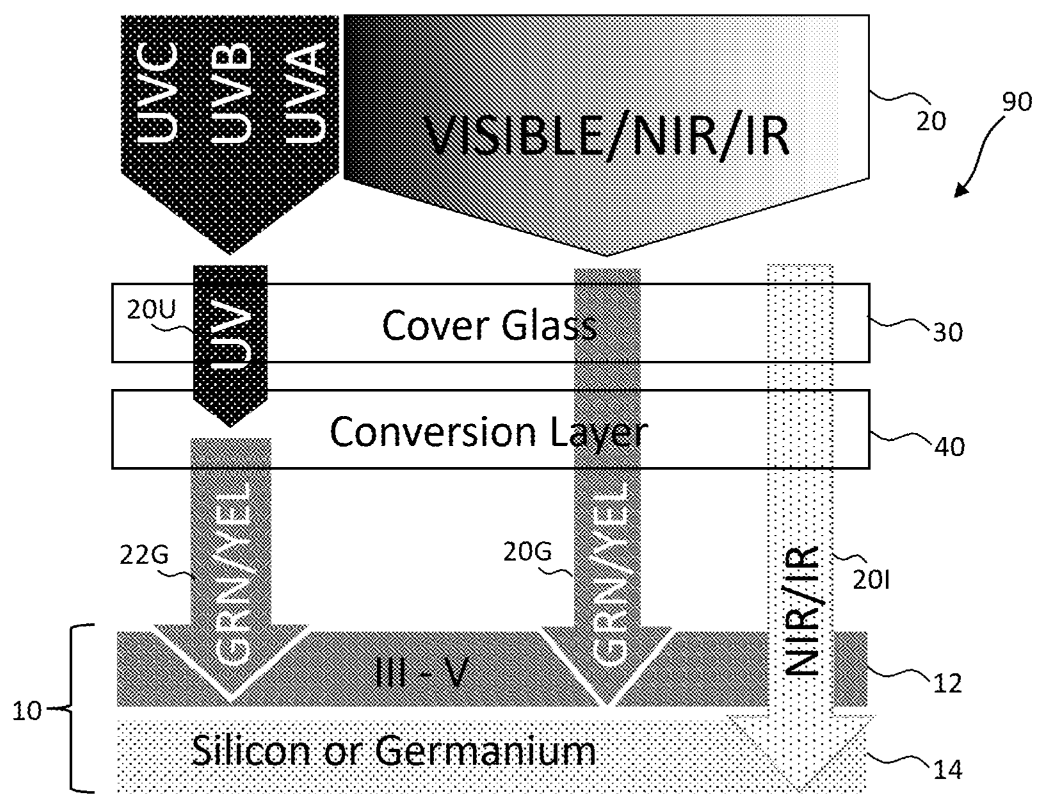

FIG. 3 illustrates a prior-art dual-junction solar cell with perovskite and silicon having an efficiency of up to about 25~29% with a protective layer 32 that protects Perovskite from degradation due to environmental exposure and FIGS. 4A-4C illustrate photovoltaic systems 90 according to embodiments of the present disclosure using the same perovskite and silicon photovoltaic cell stack 10 (e.g., first photovoltaic cell 12 comprising perovskite sensitive to red, green-to-yellow, and blue light 20R, 20G, 20B and second photovoltaic cell 14 (in this case a bottom one of two photovoltaic cells) sensitive to infrared or near infrared light 20I) with a substrate 30 (e.g., cover glass 30). As shown in FIGS. 4A-4C, light-conversion layer 40 can improve the efficiency of photovoltaic system 90, for example by approximately 1% to 5%, by converting incident light 20 outside the frequency sensitive range (e.g., ultraviolet light 20U) to which first and second photovoltaic cells 12, 14 are sensitive into converted light 22 inside the frequency range to which at least one of first and second photovoltaic cells 12, 14 is sensitive. Perovskite solar cell materials are largely (e.g., about 95%) sensitive to visible light. To a much lesser extent (e.g., about 5%) perovskite solar cells can also be responsive to incident light 20 in the near-infrared frequency range (e.g., at least some IR light 20I). This can be true for both tandem solar cells comprising perovskite and silicon (e.g., as illustrated in FIGS. 4A-4C) and for tandem cells comprising III-V and silicon or germanium materials (e.g., as illustrated in FIGS. 6A-6B discussed below). Therefore, for such systems, the sensitive range includes near-infrared light 20I and conversion layer 40 can convert incident light 20 outside the sensitive range (e.g., ultraviolet light 20U such as light 20 having a wavelength in the range of 200 to 375 nm) to converted light 22 inside the wavelength range (including visible light and, optionally, near-infrared light, or optionally both visible and near-infrared light, for example 600 nm to 850 nm or 650 nm to 750 nm). In some embodiments, conversion layer 40 converts incident ultraviolet light 20U into only visible light, for example inside the wavelength range 400-700 nm, as shown in FIGS. 4A-4C and 6A-6B.

In embodiments such as are shown in FIG. 4A, conversion layer 40 converts incident ultraviolet light 20U into blue converted light 22B. The blue converted light 22B, incident blue light 20B, incident green-to-yellow light 20G, and incident red light 20R are absorbed by first photovoltaic cell 12 (e.g., comprising perovskite) and incident IR light 20I is absorbed by second photovoltaic cell 14 (e.g., silicon). In embodiments such as are illustrated in FIG. 4B, conversion layer 40 converts incident ultraviolet light 20U into green-to-yellow converted light 22G. The green-to-yellow converted light 22G, incident blue light 20B, incident green-to-yellow light 20G, and incident red light 20R are absorbed by first photovoltaic cell 12 (e.g., comprising perovskite) and incident NIR-to-IR light 20I is absorbed by second photovoltaic cell 14 (e.g., silicon). In embodiments such as are illustrated in FIG. 4C, conversion layer 40 can convert some of incident light 20 (e.g., incident ultraviolet light 20U) into blue converted light 22B and some of incident light 20 (e.g., incident ultraviolet light 20U) into green-to-yellow converted light 22G. In some embodiments, converted light 22 (e.g., one or more of blue converted light 22B and green-to-yellow converted light 22G) as well as incident blue light 20B, incident green-to-yellow light 20G, and incident red light 20R are absorbed by first photovoltaic cell 12 (e.g., comprising perovskite) and incident IR light 20I can be absorbed by second photovoltaic cell 14 (e.g., silicon). The conversion of incident ultraviolet light 20U into light 20 that is absorbed by first photovoltaic cell 12 to produce electricity increases the efficiency of photovoltaic system 90. Any of the cover glass 30 arrangements shown in FIGS. 2A1-2A4 can be used with the embodiments of FIGS. 4A-4C.

FIGS. 5A and 5B illustrate prior-art dual-junction solar cells with a compound semiconductor (e.g., a III/V semiconductor) and silicon having an efficiency of up to about 20~25%. FIG. 5A illustrates a compound semiconductor tuned (e.g., by material selection or implantation) to absorb NUV-to-blue light 20B to make electricity and FIG. 5B illustrates a compound semiconductor tuned (e.g., by material selection or implantation) to absorb green-to-yellow light 20G to make electricity. FIGS. 6A and 6B illustrate photovoltaic systems 90 according to embodiments of the present disclosure using the same photovoltaic cell stacks 10 (e.g., tuned first photovoltaic cell 12 and second photovoltaic cell 14) as are shown in FIGS. 5A and 5B with a cover glass 30. In FIG. 6A, conversion layer 40 converts incident ultraviolet light 20U into blue converted light 22B. Blue converted light 22B and incident blue light 20B are absorbed by first photovoltaic cell 12 to make electricity. In FIG. 6B, conversion layer 40 converts incident ultraviolet light 20U into green-to-yellow converted light 22G. Green-to-yellow converted light 22G and incident green-to-yellow light 20G are absorbed by first photovoltaic cell 12 to make electricity. In both cases, incident IR light 20I is absorbed to second photovoltaic cell 14 (e.g., silicon or germanium) to produce electricity. Thus, light-conversion layer 40 can improve the efficiency of photovoltaic system 90, for example by approximately 1% to 5%, by converting incident light 20 outside the sensitive frequency range of first and second photovoltaic cells 12, 14 into light 20 inside the sensitive frequency range. Any of the cover glass 30 arrangements shown in FIGS. 2A1-2A4 can be used with the embodiments of FIGS. 6A and 6B.

Figure 7:
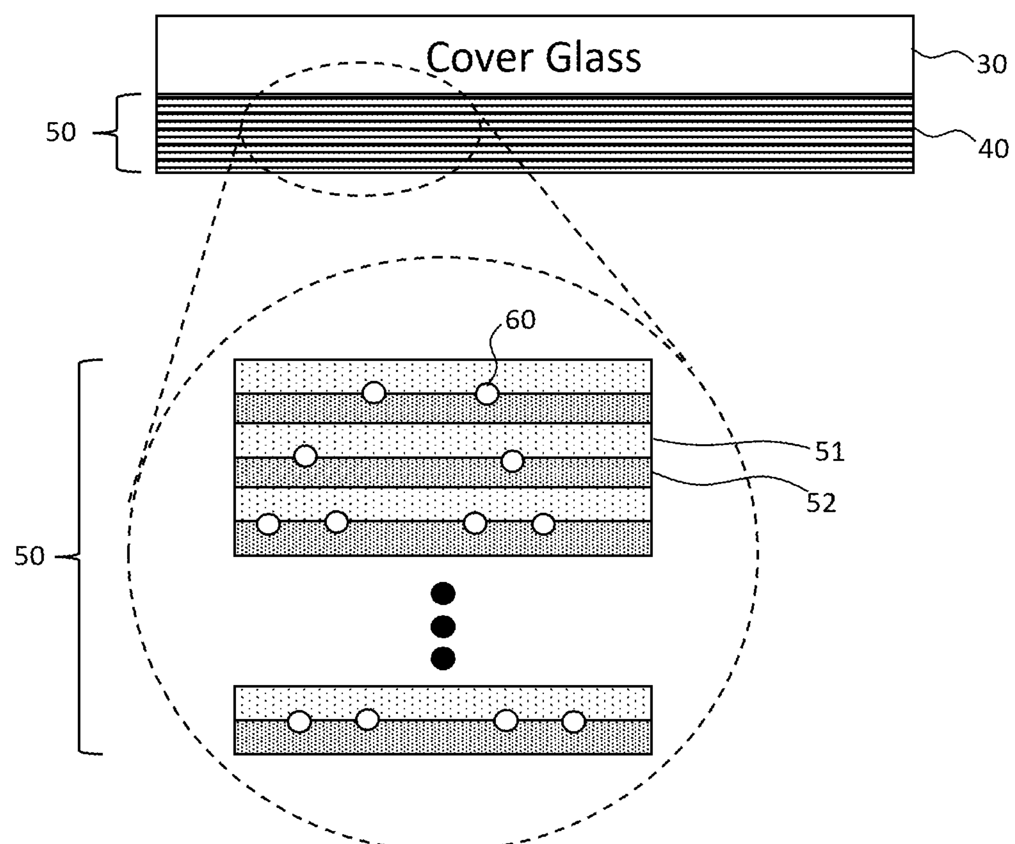
FIG. 7 illustrates an unpatterned coating disposed on a cover glass according to embodiments of the present disclosure.

FIG. 7 illustrates light-conversion layer 40 disposed on cover glass 30, for example on an inside surface, outside surface, or both sides of cover glass 30 between cover glass 30 and the photovoltaic cells (e.g., first, second, and third photovoltaic cells 12, 14, 16). Light-conversion layer 40 can be an unpatterned layer coated on cover glass 30, for example by chemical vapor deposition, metal organic chemical vapor deposition, physical vapor deposition (PVD), atomic layer deposition (ALD), sputtering, metal organic chemical vapor deposition (MOCVD), or molecular beam epitaxy (MBE) and can comprise multiple sub-layers 50 disposed in a material stack 50. Deposition parameters are described in WO 2019/087038 cited above and whose relevant contents are incorporated by reference. The number of sub-layers 50 can be two or greater, for example 50, 100, or 150 sub-layers 50 and can comprise pairs of sub-layers 50, e.g., first sub-layer 51 and second sub-layer 52 (collectively sub-layers 50). The pairs of sub-layers 50 can comprise at least a first sub-layer 51 of a first material with a thickness alternating with a second sub-layer 52 of a second material. The number of pairs of layers can be no less than 10, 20, or 50, or greater than 10, 20, or 50. The interface between the first sub-layer 51 and the second sub-layer 52 of the pairs of sub-layers 50 includes quantum nano-structures 60 that can absorb incident light 20 and emit converted light 22 at a different, lower frequency.

First sub-layer 51 can have a thickness of less than or equal to 1 micron and second sub-layer 52 can have a thickness of less than or equal 10 nm. First sub-layer 51 can be designated as a barrier layer and second sub-layer 52 can be designated as a well layer (or quantum-well layer). In some embodiments, first sub-layer 51 has a maximum thickness of 50 nm. A minimum thickness of first sub-layer 51 can have a single (e.g., only one) mono-layer of material (although embodiments of the present disclosure are not limited to such a thickness or one mono-layer and first sub-layer 51 can be thicker than 50 nm and can comprise more than one mono-layer). Such a first sub-layer 51 thickness can have a substantially improved light absorption and re-emission. Similarly, second sub-layer 52 can have a maximum thickness of 10 nm and can comprise a single (e.g., only one) mono-layer of material (although embodiments of the present disclosure can comprise second sub-layers 52 with more than one mono-layer of material). As used herein, a sub-layer comprises a common type of material and can comprise multiple mono-layers of the same material. Different sub-layers, e.g., first sub-layer 51 and second sub-layer 52 comprise different materials. Thus, in some embodiments, the quantum nano-structures are responsive to a range of frequencies of incident light that is less than all frequencies of the incident light to convert a broad frequency band of incident light outside the range into light within the range.

According to embodiments of the present disclosure, lattice parameter mismatches between the first and second sub-layers 51, 52 create a local strain at their interface, resulting in quantum nano-structures 60. Such quantum nano-structures 60 trap free current carriers (e.g., electrons and holes in a semiconductor) and improving their radiative recombination rates. In particular, quantum nano-structures 60 can absorb ultraviolet light 20U and emit visible light 20 (e.g., blue converted light 22B or green-to-yellow converted light 22G). Quantum nano-structures 60 can be quantum wells or quantum wires. Second sub-layer 52 can be roughened to enhance the formation of quantum nano-structures 60.

The color, or wavelength, of converted light 22 emitted by quantum nano-structures 60 depends on several factors in addition to the energy bandgaps of first and second sub-layers 51, 52. First, the energy quantization in such a low-dimensional quantum nano-structure 60 yields an energy transition depending on quantum nano-structure 60 size, as the smaller the structure the larger the fundamental state energy level. Second, the large polarization mismatch between first and second sub-layers 51, 52 results in a huge electric field in quantum nano-structures 60, which is about 5 MV/cm. This electric field reduces the effective transition energy in such structures. This is known as the quantum confined Stark effect (QCSE). The strong QCSE induced by the large polarization electrical field results in UV absorption by quantum nano-structure 60, while visible converted light 22 is emitted from the ground state of such quantum nano-structures 60. By carefully controlling quantum nano-structure 60 size, the energy transition, and thus the emitted converted light 22, can be tuned over a broad range of colors and can be matched to the absorption of the underlying photovoltaic cell junction (e.g. first photovoltaic cell 12), thus improving the efficiency of the photovoltaic cell.

According to embodiments of the present disclosure, quantum nano-structures 60 can absorb a range of frequencies of incident light 20 and is therefore a broad-band light converter 40. Other structures, for example quantum dots absorb and emit specific frequencies of incident light 20 and are therefore narrow-band light emitters. Although a variety of different quantum dots that absorb and emit different frequencies of light 20 and converted light 22 can convert a variety of incident light 20 with different frequencies, a suitable variety of quantum dots are expensive to make and are less efficient than a layer of broadband conversion material (e.g., light-conversion layer 40) that can respond to a range of frequencies of incident light 20.

According to embodiments of the present invention, second sub-layer 52 can be or comprise GaInN or AlGaInN and first sub-layer 51 can be or comprise GaN, AlGaN, or InAlGaN. The first sub-layer 51 material can have a thickness of 4-5 nm, for example, and the second sub-layer 52 material can have a thickness of, for example, 1.5-2 nm. With 5-100 pairs (e.g., no less than 10 or greater than 10), or more, of such layers, an absorption rate of some UV light 20U (e.g., outside the sensitive frequency range of photovoltaic cell stack 10) can be up to 95% of the maximum expected absorption efficiency. With 5 to 100 pairs, or more, of such layers, an absorption rate of some UV light 20U (e.g., outside the sensitive frequency range) can be up to 95% of the maximum expected absorption efficiency. By using thinner sub-layers 50 in material stack 50, transparency of material stack 50 is increased, resulting in less absorption of incident light 20 and improved efficiency.

Thus, according to some embodiments of the present disclosure, first sub-layer 51 is no less than 1.5 times (e.g., no less than 2 times) the thickness of second sub-layer 52. In some embodiments, first sub-layer 51 is no greater than 3.5 times (e.g., no greater than 3.33 times) the thickness of second sub-layer 52. In some embodiments, first sub-layers 51 have a thickness no greater than 1 micron, no greater than 500 nm, no greater than 250 nm, no greater than 100 nm, no greater than 50 nm, no greater than 25 nm, no greater than 10 nm, or no greater than 5 nm. In some embodiments, second sub-layers 52 have a thickness no greater than 10 nm, no greater than 5 nm, no greater than 2 nm, or no greater than 1 nm. In some embodiments, the number of pairs of sub-layers 50 is no less than or greater than 10, no less than or greater than 20, no less than or greater than 50, no less than or greater than 80, or no less than or greater than 100. Thus, according to some embodiments of the present disclosure, the number of sub-layers 50 can range from 10-100 or 20-200 but is not limited to this range. In some embodiments, material stack 50 (conversion layer 40) has a thickness less than a thickness of a single-junction solar cell, and therefore can provide an advantage in reduced thickness and mass over multi-junction solar cells with, for example, four or five junctions. For example, if first and second sub-layers 51, 52 have a combined thickness of 10 nm, a 100-layer material stack 50 has a thickness of 1 micron, which can be much less than the effective thickness of a single-junction solar cell (for example 100 to 500 microns).

Materials of the first or second sub-layers 51, 52 can comprise metal oxides or alloys thereof, dielectrics, and compound semiconductors. In some embodiments, first sub-layer 51 has a thickness in the range of 1 nm to 50 nm. In some embodiments, second sub-layer 52 has a thickness in the range of 1 nm to 20 nm. According to some embodiments, a variety of layer material pairs are possible, for example as listed below. Rare-earth elements comprising less than 10% of first sub-layer 51 can be incorporated into first sub-layer 51 to control the amount or frequency of light 20 emitted by quantum nano-structures 60. First sub-layer 51 can incorporate GaN and no greater than 50% of indium, aluminum, arsenic, or phosphor to control the amount or frequency of light 20 emitted by quantum nano-structures 60. Stack materials can comprise layer combinations of II-VI and III-V materials.

According to embodiments of the present disclosure and as shown in FIG. 7, light-conversion layer 40 can comprise a plurality of sub-layers 50 in a material stack 50. The plurality of sub-layers 50 can comprise at least a first sub-layer 51 of a first material alternating with a second sub-layer 52 of a second material to form multiple pairs of first and second sub-layers 51, 52 in material stack 50. Each pair of sub-layers (e.g., first and second sub-layers 51, 52) can comprise one first sub-layer 51 adjacent to and in contact with one second sub-layer 52. The interface between the first sub-layer 51 and the second sub-layer 52 of the pairs of sub-layers includes quantum nano-structures 60. The second material can comprise GaInN. The first material can comprise at least GaN, AlGaN, or InAlGaN. In some embodiments, the quantum nano-structures are responsive to a range of frequencies of incident light that is less than all frequencies of the incident light to convert a broad frequency band of incident light outside the range into light within the range.

At least some of first sub-layers 51 (e.g., GaN sub-layers) can be doped (e.g., either p-doped or n-doped). In some embodiments, some of first sub-layers 51 have a common doping (e.g., some of the GaN sub-layers are n-doped) and the others of first sub-layers 51 are not doped. In some embodiments, all of first sub-layers 51 or all of second sub-layers 52 have a common doping (e.g., all of the GaN layers are p-doped or all of the GaN layers are n-doped). In some embodiments and as shown in FIG. 8, all of first sub-layers 51 (e.g., GaN sub-layers) are n-doped.

Figure 8:
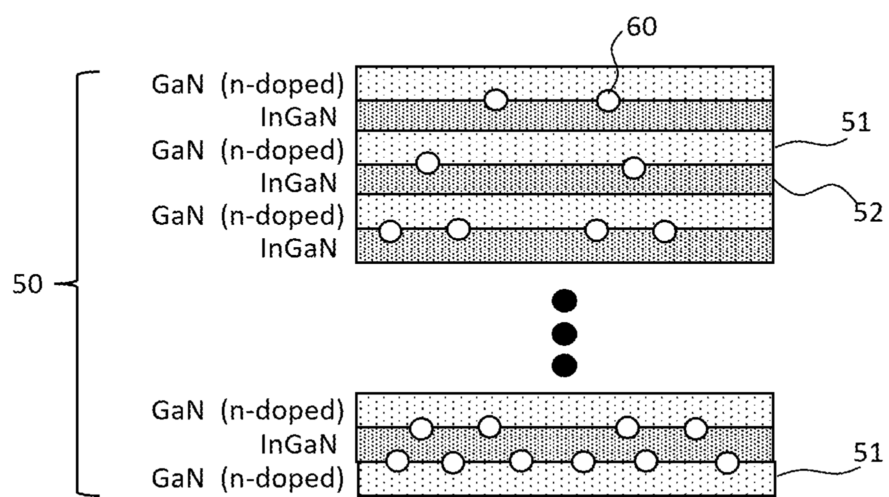
FIG. 8 illustrates an unpatterned coating disposed on a cover glass according to embodiments of the present disclosure.

In some embodiments and as also shown in FIG. 8, material stack 50 comprises an additional single sub-layer (e.g., not a pair of sub-layers), such as an additional first sub-layer 51, disposed on the top or bottom of material stack 50 and adjacent to a sub-layer of a different type (e.g., an additional single first sub-layer 51 adjacent to a second sub-layer 52 on the top or bottom of material stack 50) so that material stack 50 has an odd number of sub-layers. In some embodiments, material stack 50 does not conduct electrical current (e.g., is not electrically responsive to emit light) but rather is optically responsive (e.g., only optically responsive) to emit light. (The labels ‘first’ and ‘second’ are arbitrary and can be exchanged in embodiments of the present disclosure.)

In operation, the first sub-layers 51 (e.g., the GaN sub-layers) can absorb UV light and the quantum wells in the interface between second sub-layer 52 (e.g., InGaN) and first sub-layers 51 (e.g., GaN) can emit visible light, In some embodiments, the number of sub-layers (e.g., first and second sub-layers 51, 52) is no less than 50. The first sub-layer 51 can have a thickness of less than or equal to 1 micron and the second sub-layer 52 can have a thickness of less than or equal 10 nm. The first sub-layer 51 can have a thickness between 1.5 and 3.5 times a thickness of the second sub-layer layer 52. The conversion layer 40 can be responsive to ultraviolet light to emit visible light or infrared light.

According to some embodiments, light-conversion layer 40 can comprise a support layer 30 (e.g., cover glass 30 or substrate 30) and material stack 50 can be disposed on support layer 30. The support layer can be a dielectric layer so that an electrical current cannot conduct through material stack 50. In some embodiments, light-conversion layer 40 can comprise a support layer 30 and a buffer layer 70 and buffer layer 70 is disposed on support layer 30 and material stack 50 is disposed on buffer layer 70 on a side of buffer layer 70 opposite support layer 30. Buffer layer 70 can comprise one or more of a layer of GaInN or a layer of InAlN. Buffer layer 70 of GaInN can be 3-10 microns thick or buffer layer 70 of InAlN can be 3-10 microns thick. A buffer layer 70 of GaInN can have a different indium content than first sub-layer 51 that can comprise GaInN. In some embodiments, buffer layer 70 can comprise multiple sub-layers. Support layer 30 can be a dielectric layer so that an electrical current cannot conduct through buffer layer 70 and material stack 50.

Thus, according to some embodiments, a light-conversion layer 40 can comprise a support layer 30, a buffer layer 70 disposed on support layer 30, and a plurality of sub-layers (e.g., first and second sub-layers 51, 52) in a material stack 50 disposed on a side of buffer layer 70 opposite support layer 30. The plurality of sub-layers (e.g., first and second sub-layers 51, 52) can comprise at least a first sub-layer 51 of a first material alternating with a second sub-layer 52 of a second material to form multiple pairs of first and second sub-layers 51, 52 in material stack 50, each pair of sub-layers comprising one first sub-layer 51 and one second sub-layer 52. The interface between first sub-layer 51 and second sub-layer 52 of the pairs of sub-layers includes quantum nano-structures 60.

According to embodiments of the present disclosure, a variety of material types and combinations are useful in conversion layer 40. The materials are listed in pairs divided by a slash ‘/’ corresponding to second sub-layer 52 and first sub-layer 51 respectively, e.g., second sub-layer 52 material/first sub-layer 51 material. A binary material includes two elements, a ternary material includes three elements, and a quaternary material includes four elements. Such material types and combinations can include (with percentages given in atom %) III-V systems having different layer material combinations:

System #1: GaInN/GaN as basic materials:
  Quaternary/Binary=>AlGaInN/GaN (with: Al≤15% in AlGaInN).

System #2: GaInN/AlGaN as basic materials:
  Quaternary/Ternary=>AlGaInN/AlGaN (with: Al≤15% in AlGaInN);
  Ternary/Quaternary=>GaInN/InAlGaN (with: In≤15% in InAlGaN); and
  Quaternary/Quaternary=>AlGaInN/InAlGaN (with: Al≤15% in AlGaInN/In ≤15% in InAlGaN).

Other embodiments of the present disclosure combine the previous two Nitride systems and an in-between Oxide layer (e.g. an Oxide layer between each Nitride pair demarcated by a a second slash '/'):

System #3: GaInN/GaN/SiO2 as basic material:
  Quaternary/Binary/Binary=>AlGaInN/GaN/SiO2 (with: Al≤15% in AlGaInN).

System #4: GaInN/GaN/ZnO as basic material:
  Quaternary/Binary/Binary=>AlGaInN/GaN/ZnO (with: Al≤15% in AlGaInN).

System #5: GaInN/GaN/Al2O3 as basic material:
  Quaternary/Binary/Binary=>AlGaInN/GaN/Al2O3 (with: Al≤15% in AlGaInN).

System #6: GaInN/GaN/TiO2 as basic material:
  Quaternary/Binary/Binary=>AlGaInN/GaN/TiO2 (with: Al≤15% in AlGaInN).

System #7: GaInN/AlGaN/SiO2 as basic material:
  Quaternary/Ternary/Binary=>AlGaInN/AlGaN/SiO2 (with: Al≤15% in AlGaInN);
  Ternary/Quaternary/Binary=>GaInN/InAlGaN/SiO2 (with: In≤15% in InAlGaN); and
  Quaternary/quaternary/Binary=>AlGaInN/InAlGaN/SiO2 (with: Al≤15% in AlGaInN/In≤15% in InAlGaN).

System #8: GaInN/AlGaN/ZnO as basic material:
  Quaternary/Ternary/Binary=>AlGaInN/AlGaN/ZnO (with: Al≤15% in AlGaInN);
  Ternary/Quaternary/Binary=>GaInN/AlGaInN/ZnO (with: In≤15% in AlGaInN);
  Quaternary/quaternary/Binary=>AlGaInN/InAlGaN/ZnO (with: Al≤15% in AlGaInN/In≤15% in InAlGaN);

System #9: GaInN/AlGaN/Al2O3 as basic material:
  Quaternary/Ternary/Binary=>AlGaInN/AlGaN/Al2O3 (with: Al≤15% in AlGaInN);
  Ternary/Quaternary/Binary=>GaInN/InAlGaN/Al2O3 (with: In≤15% in InAlGaN); and
  Quaternary/quaternary/Binary=>AlGaInN/InAlGaN/Al2O3 (with: Al≤15% in AlGaInN/In≤15% in InAlGaN).

System #10: GaInN/AlGaN/TiO2 as basic material:
  Quaternary/Ternary/Binary=>AlGaInN/AlGaN/TiO2 (with: Al≤15% in AlGaInN);
  Ternary/Quaternary/Binary=>GaInN/InAlGaN/TiO2 (with: In≤15% in InAlGaN); and
  Quaternary/quaternary/Binary=>AlGaInN/InAlGaN/TiO2 (with: Al≤15% in AlGaInN/In≤15% in InAlGaN).

Figure 9:
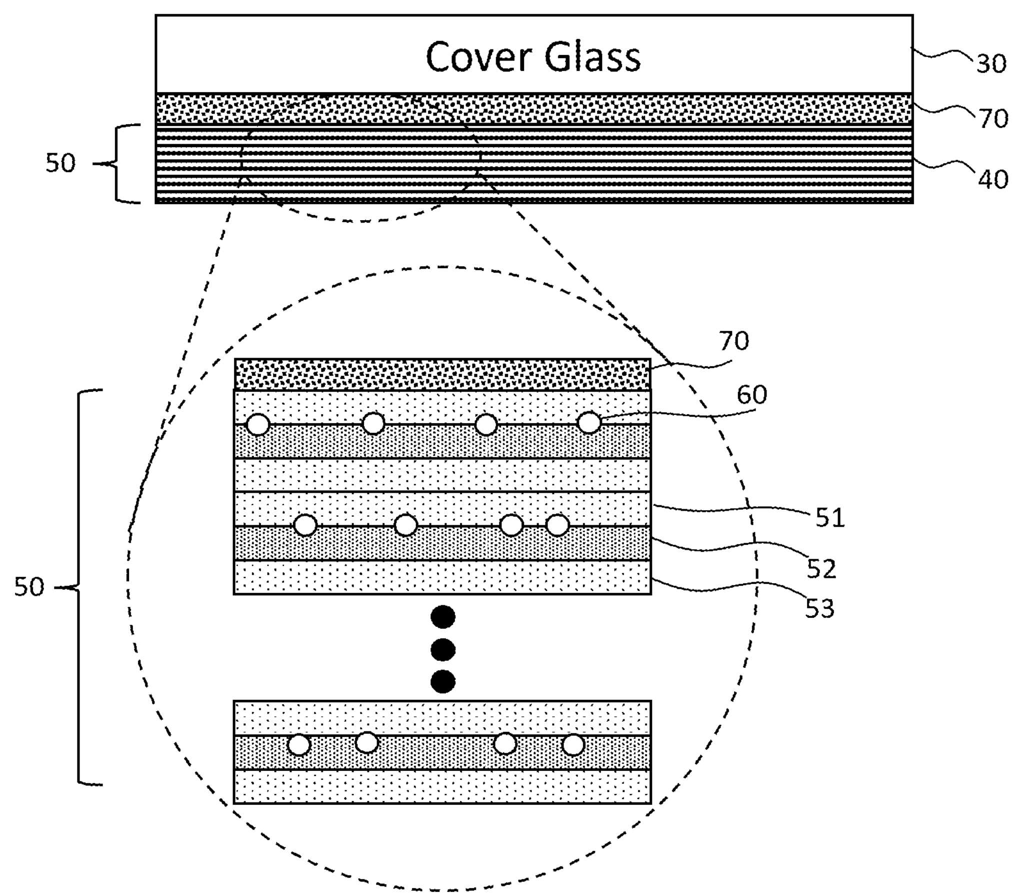
FIG. 9 illustrates an unpatterned coating having three sub-layers disposed on a cover glass with a buffer layer according to embodiments of the present disclosure.

In some embodiments and as illustrated in FIG. 9, a third sub-layer 53 is disposed between the pairs of first and second sub-layers 51, 52. Such a third sub-layer 53 can help to control the bandgap energy structure and formation of quantum nano-structures 60. Third sub-layer 53 can comprise one or more of SiO2, ZnO, Al2O3, and TiO2. Third sub-layer 53 can be a metal sulfide, e.g., ZnS, CdS, cadmium telluride, cadmium selenide, or an alloy thereof. According to some embodiments, third sub-layer 53 can be MN and can have a thickness in the range of 1 to 10 nm, for example 2 to 5 nm, for example 3 nm.

In some embodiments and as illustrated in FIG. 9, a buffer layer 70 can be disposed between cover glass 30 and material stack 50. Such a buffer layer 70 can reduce defects in first and sub-layers 51, 52 (and optionally third sub-layer 53) that can trap converted photons and reduce radiative efficiency for converted light 22. In some embodiments, buffer layer 70 comprises multiple sub-layers 50. For example, buffer layer 70 can comprise a thin sub-layer 50, typically 10-200 nm thick, followed by a sub-layer 50, typically 150-1000 nm thick. Buffer layers 70 can be useful for various types of cover glass 30 and material stacks 50, for example but not limited to cover glass 30 comprising a sapphire, silicon or mineral glass substrate 30 and for material stacks 50 comprising GaInN/GaN second and first sub-layers 52, 51, respectively. Buffer layers 70 can be deposited using the same deposition methods as are used to deposit material stack 50.

Figure 10:
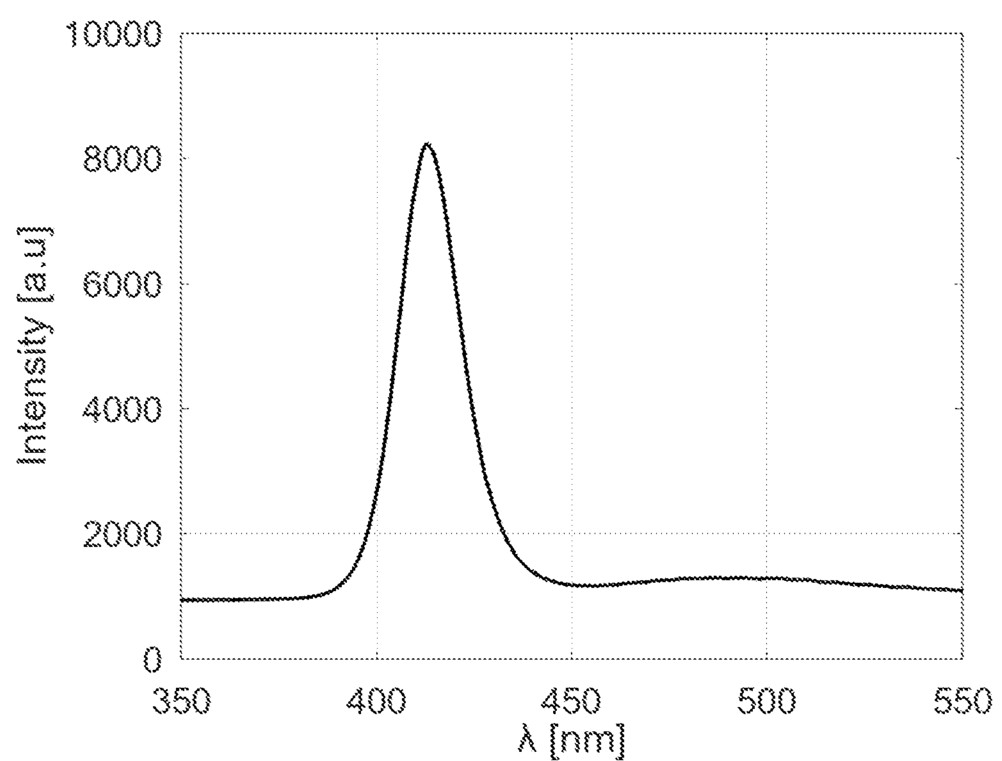
FIG. 10 is a graph illustrating the response of a light conversion layer when exposed to ultraviolet radiation useful in understanding embodiments of the present disclosure.

FIG. 10 is a graph illustrating the frequency response of light-conversion layer 40 using material stacks 50 illuminated with ultraviolet light.

As shown in FIGS. 2A, 2B, 4A, 4B, 4C, 6A, and 6B and according to embodiments of the present disclosure, photovoltaic systems 90 can comprise 3 or fewer photovoltaic cells (e.g., first, second, or third photovoltaic cells 12, 14, 16) and convert light 20 having a frequency range encompassing ultraviolet light 20U, visible light (e.g., red light 20R, green-to-yellow light 20G, and blue light 20B) and infrared light 20I into electricity. In some embodiments of the present disclosure, photovoltaic systems 90 comprise three photovoltaic cells (e.g., first, second, or third photovoltaic cells 12, 14, 16) that convert at least some ultraviolet light 20U and at least some visible light 20 into electricity. In some embodiments, photovoltaic systems 90 comprise two photovoltaic cells (e.g., first and second photovoltaic cells 12, 14) that convert at least some ultraviolet light 20U and at least some visible light 20 into electricity. In some embodiments, photovoltaic systems 90 comprise two photovoltaic cells (e.g., first and second photovoltaic cells 12, 14) that convert at least some ultraviolet light 20U, at least some visible light 20, and at least some infrared light 20I into electricity. At least some ultraviolet light 20U can comprise any one of UV-A light, UV-B light, or UV-C light or any combination thereof.

Light-conversion layers 40 and buffer layers 70 of these materials can be substantially transparent to visible light 20, for example no less than 50% transparent to visible light 20, no less than 60% transparent to visible light 20, no less than 70% transparent to visible light 20, no less than 80% transparent to visible light 20, no less than 90% transparent to visible light 20, or no less than 95% transparent to visible light 20.

Cover glass 30 can comprise any useful glass, including borosilicate glass, mineral glass, or sapphire glass. Some prior-art solar cells use UV filters to prevent ultraviolet light 20U from impinging on photovoltaic cell stacks 10 (e.g., comprising one or more of first, second, and third photovoltaic cells 12, 14, 16) since such UV light 20U irradiation can potentially degrade the photovoltaic cells in the photovoltaic cell stack 10 within a year or two of entering service, especially in space applications. Furthermore, such UV light 20U filters can comprise transparent material compounds whose transparency diminishes over time, reducing the efficiency of prior-art photovoltaic system. Extreme temperature changes (e.g., from below 100 degrees C. to above 100 degree C.), as are commonly found in space, can also cause material deterioration and diminished transparency. As well, continuous or repeated long-time exposure to space UV light can additionally contribute to material deterioration and diminished transparency. Conversion layers 40 according to embodiments of the present disclosure can substantially (e.g., effectively) absorb incident UV light 20U and convert the absorbed light 20 into visible converted light 22. Moreover, conversion layers 40 of the present disclosure show substantially less or no loss of transparency due to UV light 20U exposure or exposure to extreme temperature variations. Thus, embodiments of the present disclosure are not only more efficient but can dispense with such UV filters since the conversion layers 40 can substantially prevent UV light 20U from impinging on the photovoltaic cells and can have a longer lifetime.

Embodiments of the present disclosure provide photovoltaic systems 90 that convert light 20 into electricity with greater efficiency and reduced cost. Embodiments of the present disclosure provide photovoltaic systems 90 that convert light 20 into electricity with reduced size and mass. Such reduced size and mass embodiments are particularly useful for applications having size and mass constraints, for example in space and satellite applications.

PARTS LIST

10 photovoltaic cell stack
12 first photovoltaic cell/top cell
14 second photovoltaic cell/middle cell
16 third photovoltaic cell/bottom cell
20 light
20B blue light/NUV-to-blue
20G green-to-yellow light
20I infrared light/near-infrared light
20R red light/red-to-NIR light
20U ultraviolet light
22 converted light
22B blue converted light
22G green-to-yellow converted light
30 substrate/cover glass/support layer
32 protective layer
40 layer/conversion layer/light-conversion layer/light converter
50 sub-layers/material stack
51 first sub-layer
52 second sub-layer
53 third sub-layer
60 quantum nano-structures
70 buffer layer
90 photovoltaic system

What is claimed:

1. A light-conversion layer, comprising:

a buffer layer;

a plurality of sub-layers in a material stack disposed on the buffer layer, the plurality of sub-layers comprising at least a first sub-layer of a first material alternating with a second sub-layer of a second material to form multiple pairs of first and second sub-layers in the material stack, each pair of sub-layers comprising one first sub-layer adjacent to and in contact with one second sub-layer, said first material being different from said second material, wherein the interface between the first sub-layer and the second sub-layer of the pairs of sub-layers includes quantum nano-structures that are quantum wells, wherein the quantum nano-structures convert a broad frequency band of incident light outside a range that is less than all frequencies of the incident light into light within the range, and wherein the first material comprises GaInN (InGaN), the second material comprises GaN or InGaN, the buffer layer comprises InGaN having a different indium content than the first sub-layer, wherein the material stack has a thickness less than a thickness of a single-junction solar cell and comprises no less than 10 and no greater than 50 pairs of sub-layers, and wherein the light-conversion layer is no less than 70% transparent to visible light.

2. The light-conversion layer of claim 1, wherein the number of sub-layers is no less than 50.

3. The light-conversion layer of claim 1, wherein the first sub-layer has a thickness of less than or equal to 1 micron and the second sub-layer has a thickness of less than or equal to 10 nm.

4. The light-conversion layer of claim 1, wherein the first sub-layer has a thickness between 1.5 and 3.5 times a thickness of the second sub-layer.

5. The light-conversion layer of claim 1, wherein the conversion layer is responsive to ultraviolet light to emit visible light or infrared light.

6. The light-conversion layer of claim 1, comprising a support layer and the material stack is disposed on the support layer.

7. The light-conversion layer of claim 6, wherein the support layer is a dielectric.

8. The light-conversion layer of claim 1, comprising a support layer and the buffer layer is disposed on the support layer and the material stack is disposed on the buffer layer on a side of the buffer layer opposite the support layer.

9. The light-conversion layer of claim 8, wherein the support layer is a dielectric.

10. The light-conversion layer of claim 1, wherein the first sub-layers have a common doping.

11. The light-conversion layer of claim 10, wherein the first sub-layers are all n-doped or all p-doped.

* * * * *